(12) United States Patent
Kimura

(10) Patent No.: US 7,039,383 B2
(45) Date of Patent: May 2, 2006

(54) QUADRATURE MIXER CIRCUIT INCLUDING THREE-INPUT LOCAL MIXERS

(75) Inventor: Katsuji Kimura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 498 days.

(21) Appl. No.: 10/307,932

(22) Filed: Dec. 3, 2002

(65) Prior Publication Data

US 2003/0119474 A1    Jun. 26, 2003

(30) Foreign Application Priority Data

Dec. 4, 2001    (JP)    ............................. 2001-370741

(51) Int. Cl.
*H04B 1/28* (2006.01)
*H04B 1/26* (2006.01)

(52) U.S. Cl. .................. 455/333; 455/315; 455/318; 455/324; 327/119

(58) Field of Classification Search ................ 455/302, 455/313, 314, 323, 324, 326, 333, 285, 315, 455/318; 327/119, 355, 357, 359
See application file for complete search history.

(56) References Cited

U.S. PATENT DOCUMENTS 5,303,417 A    4/1994    Laws
5,448,772 A    9/1995    Grandfield
5,761,615 A    6/1998    Jaffee (Continued)

FOREIGN PATENT DOCUMENTS

| JP | 58-187005 | 1/1983 |
|---|---|---|
| JP | 07-129697 | 5/1995 |
| JP | 09-205382 A | 8/1997 |
| JP | 10-105632 | 4/1998 |

(Continued)

OTHER PUBLICATIONS

Yamaji et al., "An I/Q Active Balanced Harmonic Mixer with IM2 Cancelers and a 45° Phase Shifter", *IEEE Journal of Solid-State Circuits*, Dec. 1998, pp. 2240-2246, vol. 33, No. 12, IEEE.

(Continued)

*Primary Examiner*—Quochien B. Vuong
(74) *Attorney, Agent, or Firm*—Foley & Lardner LLP

(57) ABSTRACT

In a quadrature mixer circuit for receiving a radio frequency signal to generate first and second quadrature output signals, a first three-input mixer receives the radio frequency signal, a first local signal having a first frequency and a second local signal having a second frequency to generate the first quadrature output signal, and a second three-input mixer receives the radio frequency signal, the first local signal and the second local signal to generate the second quadrature output signal. The second local signal received by the first three-input mixer and the second local signal received by the second three-input mixer being out of phase by $\pi/2$ from each other.

18 Claims, 23 Drawing Sheets

U.S. PATENT DOCUMENTS

| | | | |
|---|---|---|---|
| 5,995,819 A | 11/1999 | Yamaji et al. | |
| 6,031,409 A | 2/2000 | Kimura | |
| 6,041,223 A * | 3/2000 | Thomas | 455/326 |
| 6,144,845 A | 11/2000 | Durec | |
| 6,144,846 A | 11/2000 | Durec | |
| 6,370,372 B1 | 4/2002 | Molnar et al. | |
| 6,396,330 B1 * | 5/2002 | Fujii | 327/359 |
| 6,411,801 B1 * | 6/2002 | Kim et al. | 455/333 |
| 6,531,920 B1 * | 3/2003 | Ishihara | 327/359 |
| 2002/0049043 A1 * | 4/2002 | Gamliel | 455/323 |
| 2003/0078017 A1 | 4/2003 | Casagrande | |

FOREIGN PATENT DOCUMENTS

| | | |
|---|---|---|
| JP | 10-105632 A | 4/1998 |
| JP | 10-242880 | 9/1998 |
| JP | 2001-520815 | 10/2001 |
| JP | 2003-188649 | 7/2003 |
| JP | 2004-518315 | 6/2004 |
| WO | WO 02/27954 | 4/2002 |

OTHER PUBLICATIONS

Keng Leong Fong and Robert G. Meyer, "Monolithic RF Active Mixer Design," IEEE Transactions on Circuits and Systems-II: Analog Digital Signal Processing, vol. 46, No. 3, Mar. 1999.

* cited by examiner

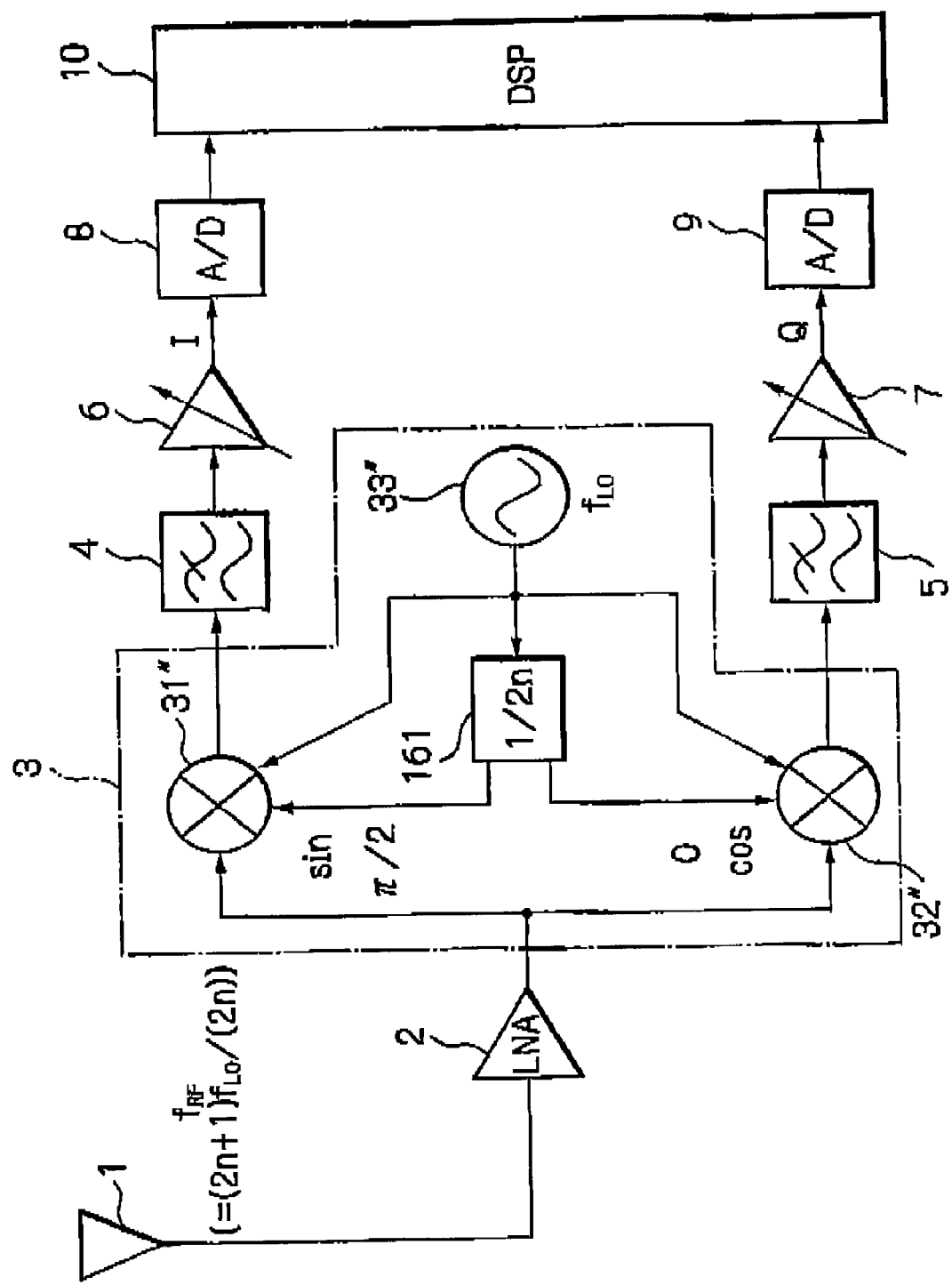

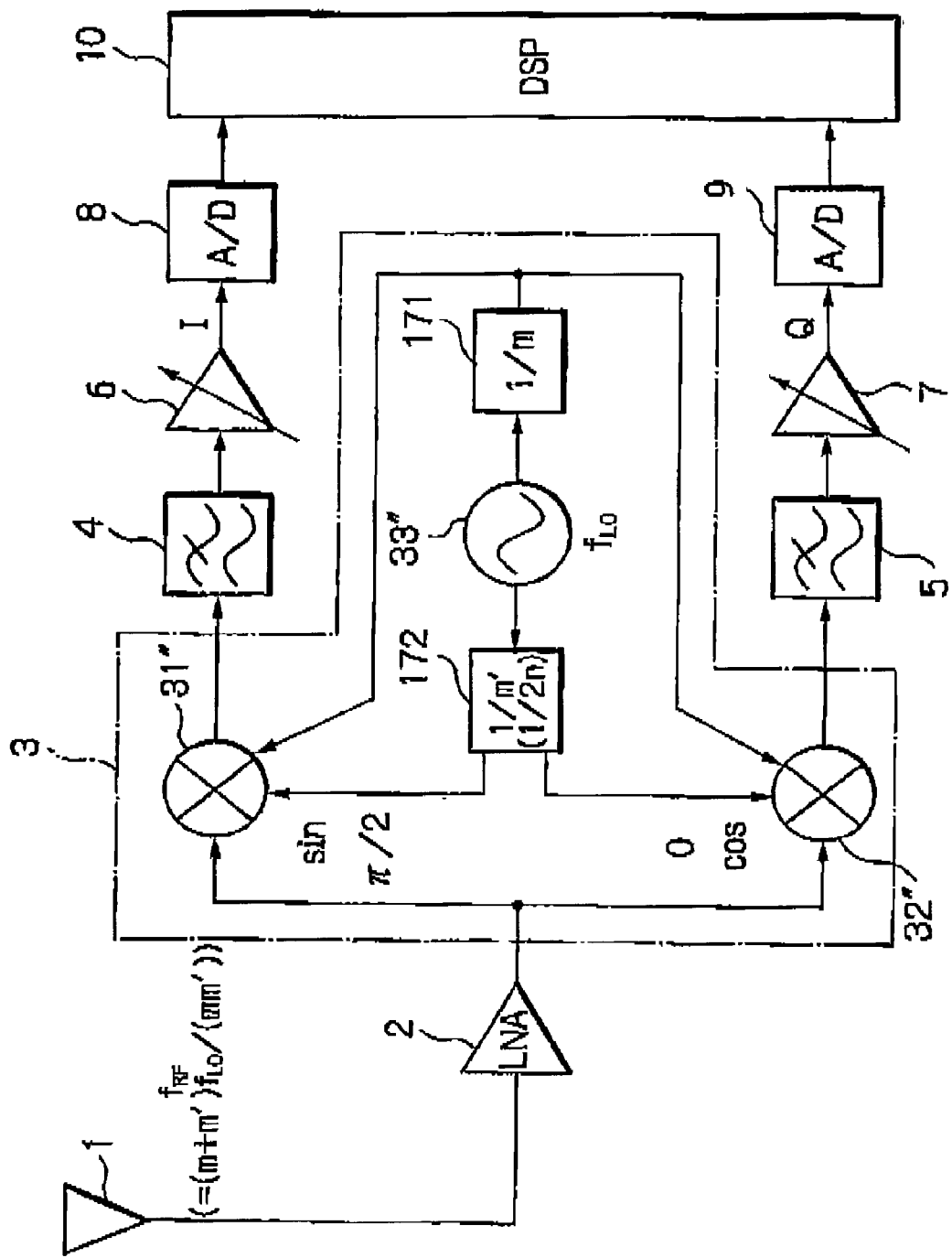

Fig. 18

| m | m' | $(m+m')/mm' = f_{RF}/f_{LO}$ |
|---|---|---|
| 3,5,7,9,10,11,13,14,15,·· | 2 | 5/6,7/10,9/14,11/18,3/5,13/22,15/26,4/7,17/30,·· |
| 3,4,5,6,7,9,10,11,12,13,·· | 4 | 7/12,1/2,9/20,5/12,11/28,13/36,7/20,15/44,1/3, 17/52,·· |
| 2,4,5,6,7,8,10,11,13,·· | 6 | 2/3,5/12,11/30,1/3,13/42,7/24,4/15,17/66,19/78·· |

Fig. 19

| m | n | $(m+2n)/(2mn) = f_{RF}/f_{LO}$ |
|---|---|---|
| 3,5,7,9,10,11,13,14,15,·· | 1 | 5/6, 7/10, 9/14, 11/18, 3/5, 13/22, 15/26, 4/7, 17/30, ·· |
| 3,4,5,6,7,9,10,11,12,13,·· | 2 | 7/12, 1/2, 9/20, 5/12, 11/28, 13/36, 7/20, 15/44, 1/3, 17/52, ·· |
| 2,4,5,6,7,8,10,11,13,·· | 3 | 2/3, 5/12, 11/30, 1/3, 13/42, 7/24, 4/15, 17/66, 19/78, ·· |

QUADRATURE MIXER CIRCUIT INCLUDING THREE-INPUT LOCAL MIXERS

BACKGROUND OF THE INVENTION

1. Field of the Invention

The present invention relates to a quadrature mixer circuit applied to a wireless receiver, and more particularly, to a quadrature mixer circuit applied to a zero intermediate frequency (IF) type (a so-called direct conversion type) wireless receiver or a low IF type wireless receiver.

2. Description of the Related Art

While super heterodyne type wireless receivers have excellent noise figure (NF) characteristics, the super heterodyne type wireless receivers have a large number of components including local oscillators, image removing filters and an IF band-pass filter, which is an obstacle for incorporating a radio frequency (RF) portion and a baseband portion into one chip.

In order to decrease the number of components, various direct conversion type wireless receivers have been developed. In this case, the improvement of quadrature mixer circuits applied to such direct conversion type wireless receivers is indispensable.

In a first prior art quadrature mixer circuit using two-input mixers (see: FIG. 29 of JP-A-9-205382), since a local oscillator signal has the same frequency as that of a radio frequency (RF) signal, a DC offset cannot be completely removed, which requires DC offset removing circuits. Also, trouble in reception sensitivity may be generated. Further, the reception sensitivity of other wireless receivers may be suppressed. This will be explained later in detail.

Even in a second prior art quadrature mixer circuit using two-input mixers and a local oscillator signal having a half frequency of the RF signal, the same disadvantages as the first prior art quadrature mixer circuit exist. This also will be explained later in detail.

In a third prior art quadrature mixer circuit (see: JP-A-9-205382 & Takafumi Yamaji et al, "An I/Q Active Balanced Harmonic Mixer with IM2 Cancelers and a 45° Phase Shifter", IEEE Journal of Solid-State Circuits, Vol. 33, No. 12, pp. 2240–2246, December 1998), two-input even-ordered harmonic mixers, a voltage controlled oscillator having a frequency different from the frequency of the RF signal and a π/4 phase shifter are provided. In the third prior art quadrature mixer circuit, however, it is difficult to realize the π/4 phase shifter. This also will be explained later in detail.

SUMMARY OF THE INVENTION

It is an object of the present invention to provide a quadrature mixer circuit capable of decreasing the DC offset, suppressing the reception trouble without a π/4 phase shifter and decreasing the number of components such as IF filters and second filters.

According to the present invention, in a quadrature mixer circuit for receiving an RF signal to generate first and second quadrature output signals, a first three-input mixer receives the RF signal, a first local oscillator signal having a first frequency and a second local oscillator signal having a second frequency to generate the first quadrature output signal, and a second three-input mixer receives the RF signal, the first local oscillator signal and the second local oscillator signal to generate the second quadrature output signal. The second local oscillator signal received by the first three-input mixer and the second local oscillator signal received by the second three-input mixer are out of phase by π/2 from each other.

BRIEF DESCRIPTION OF THE DRAWINGS

The present invention will be more clearly understood from the description set forth below, as compared with the prior art, with reference to the accompanying drawings, wherein;

FIG. 16 is a block circuit diagram illustrating a third embodiment of the quadrature mixer circuit applied to a direct conversion type wireless receiver according to the present invention;

FIG. 17 is a block circuit diagram illustrating a fourth embodiment of the quadrature mixer circuit applied to a direct conversion type wireless receiver according to the present invention; and FIGS. 18 and 19 are tables showing the frequency division numbers of the frequency dividers of FIG. 17.

DESCRIPTION OF THE PREFERRED EMBODIMENTS

Before the description of the preferred embodiments, prior art quadrature phase shift circuits applied to a direct conversion type wireless receiver will be explained with reference to FIGS. 1, 2, 3, 4 and 5.

Figure 1:
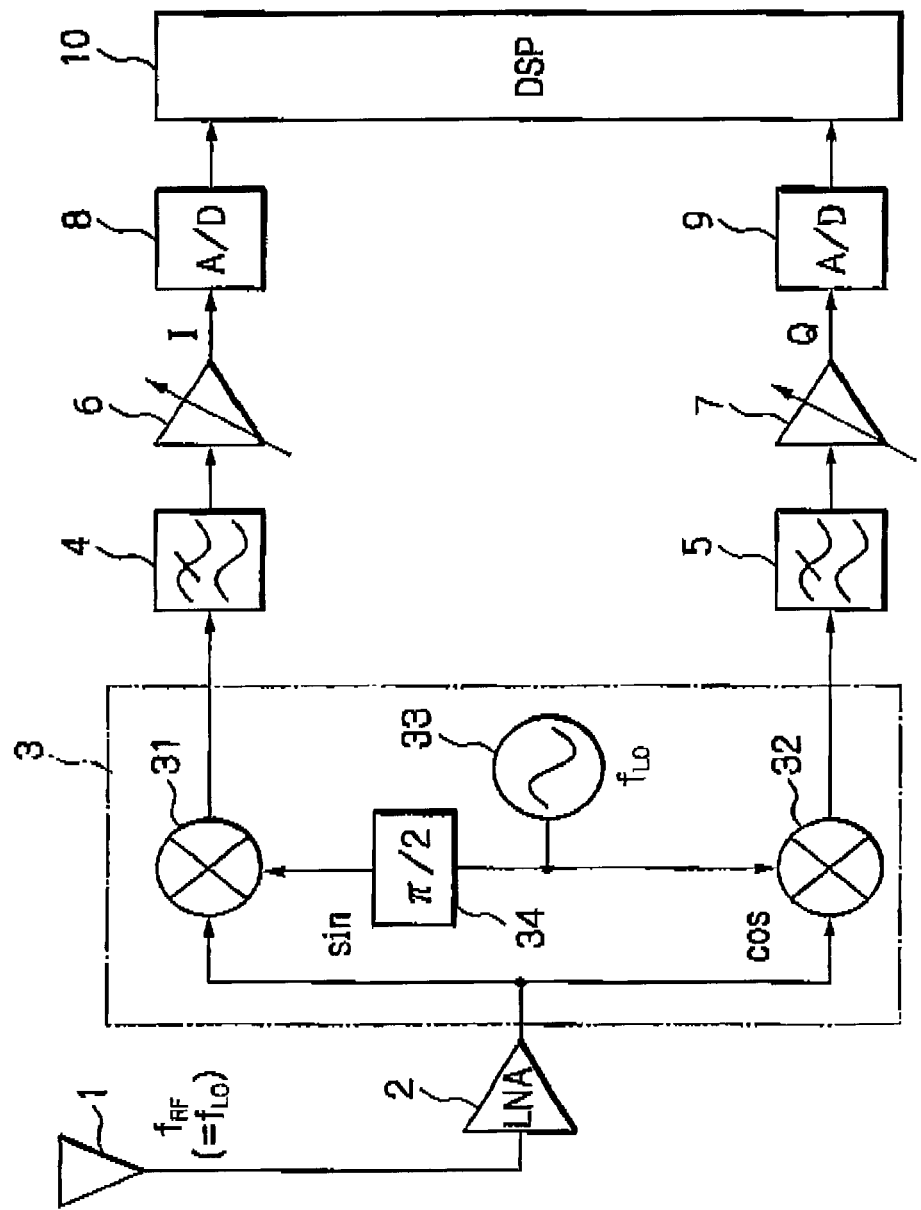
FIG. 1 is a block circuit diagram illustrating a first prior art quadrature mixer circuit applied to a direct conversion type wireless receiver.

In FIG. 1, which illustrates a first prior art quadrature phase shift circuit applied to a direct conversion type wireless receiver (see: FIG. 29 of JP-A-9-205382), an antenna 1 is connected via a low noise amplifier 2 to a quadrature mixer circuit 3 which is formed by two-input mixers 31 and 32, a voltage controlled oscillator 33 and a π/2 phase shifter 34.

Also, the low frequency components of the output signals of the two-input mixers 31 and 32 pass through low-pass filters 4 and 5, respectively, and then, the gains of the output signals of the low-pass filters 4 and 5 are controlled by automatic gain control (AGC) amplifiers 6 and 7, respectively. Thus, baseband components I and Q are obtained.

Further, the baseband components I and Q are subjected to analog-to-digital conversion by analog/digital (A/D) converters 8 and 9, and then are supplied to a digital signal processor (DSP) 10 serving as a demodulator.

The principle of the two-input mixers 31 and 32 is explained below.

In the two-input mixers 31 and 32, a second-order term of the transfer characteristics of a non-linear element is used. In the non-linear element, an input u and an output f(u) are represented by $$f(u) = a_0 + a_1 u + a_2 u^2 + \ldots + a_n u^n + \quad (1)$$

When an RF signal $u_{RF}$ having a frequency $f_{RF}$ and a local oscillator signal $u_{Lo}$ having a frequency $f_{Lo}$ are mixed at the non-linear element, the second term $a_2 u^2$ of the formula (1) is represented by $$a_2 u^2 = a_2 (u_{RF} + u_{LO})^2 = a_2 (u_{RF}^2 + u_{LO}^2 + 2 u_{RF} u_{LO}) \quad (2)$$

In this case, $$u_{RF} = U_{RF} \cdot \cos(2\pi f_{RF} t) \quad (3)$$

$$u_{LO} = U_{LO} \cdot \cos(2\pi f_{LO} t) \quad (4)$$

Therefore, the third term of the formula (2) is represented by $$2U_{RF} \cdot u_{LO} = 2U_{RF} \cdot U_{LO} \cdot \cos(2\pi f_{RF} t) \cdot \cos(2\pi f_{LO} t)$$
$$= U_{RF} \cdot U_{LO} \cdot [\cos\{2\pi(f_{RF} - f_{LO})t\} + \cos\{2\pi(f_{RF} + f_{LO})t\}] \quad (5)$$

Figure 2:
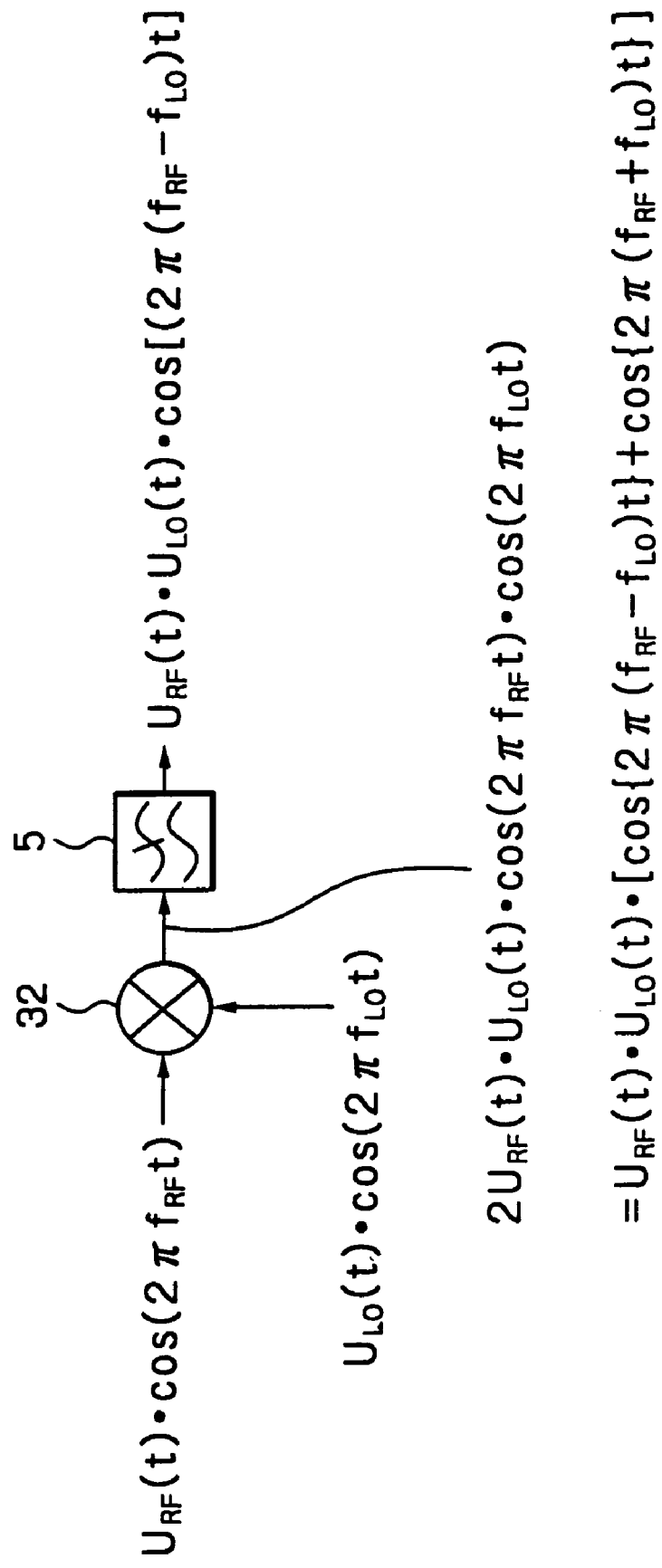
FIG. 2 is a circuit diagram for explaining a down-conversion system of the direct conversion type wireless receiver of FIG. 1.

In such a down-conversion system as illustrated in FIG. 1 where the two-input mixer 32 is followed by the low-pass filter 5, as shown in FIG. 2, only the low frequency component $U_{RF} \cdot U_{LO} \cdot \cos\{2\pi(f_{RF} - f_{LO})t\}$ in the formula (5) is obtained. Note that a difference frequency $|f_{RF} - f_{LO}|$ is defined as an intermediate frequency $f_{IF}$.

If an ideal mixer consisting of a multiplier has the same conversion gain in both frequencies $f_{RF}$ and $f_{RF} - f_{LO}$, the in-band noise power converted from two bands around the both frequencies $f_{RF}$ and $f_{RF} - f_{LO}$ is twice ($=1/(1^2+1^2)$) from the formula (5). Therefore, the noise figure (NF) of the ideal mixer becomes damaged by two, i.e., 3.01 dB, as compared with a circuit with a single-input signal and a single-output signal.

On the other hand, since the local oscillator signal $u_{LO}$ is supplied via the π/2 phase shifter 34 to the two-input mixer 31, a local oscillator signal $U_{LO}'$ supplied to the two-input mixer 31 is represented by $$u_{LO}' = U_{LO} \cdot \sin(2\pi f_{LO} t) \quad (6)$$

Therefore, the third term of the formula (2) is represented by $$2U_{RF} \cdot u_{LO}' = 2U_{RF} \cdot U_{LO} \cdot \cos(2\pi f_{RF} t) \cdot \sin(2\pi f_{LO} t)$$
$$= U_{RF} \cdot U_{LO} \cdot [-\sin\{2\pi(f_{RF} - f_{LO})t\} + \sin\{2\pi(f_{RF} + f_{LO}) t\}] \quad (7)$$

Thus, in a down-conversion system as illustrated in FIG. 1 where the two-input mixer 31 is followed by the low-pass filter 4, the component, $U_{RF} \cdot U_{LO} \cdot \sin\{2\pi(f_{RF} - f_{LO})t\}$ is obtained. Note that a difference $|f_{RF} - f_{LO}|$ is also defined as an intermediate frequency $f_{IF}$.

In the direct conversion type wireless receiver of FIG. 1, $f_{RF} = f_{LO}$, so that there is no intermediate frequency $f_{IF}(=0)$.

The direct conversion type wireless receiver of FIG. 1 has the following advantages.

① Since there is no intermediate frequency $f_{IF}(=0)$, no suppression of image is necessary, that is, no image removing filters are necessary. Also, there are few sources for generating spurious waves. Note that the low-pass filters 4 and 5 are provided in a baseband portion, and therefore, the low-pass filters 4 and 5 are easily incorporated into an integrated circuit.

② At The baseband portion as well as an RF portion including the low noise amplifier 2 and the quadrature mixer circuit 3 can be easily incorporated into one chip.

Thus, the direct conversion type wireless receiver of FIG. 1 can be easily incorporated into one chip, which would decrease the size and decrease the manufacturing cost.

On the other hand, the direct conversion type wireless receiver of FIG. 1 has the following disadvantages.

Figure 3:
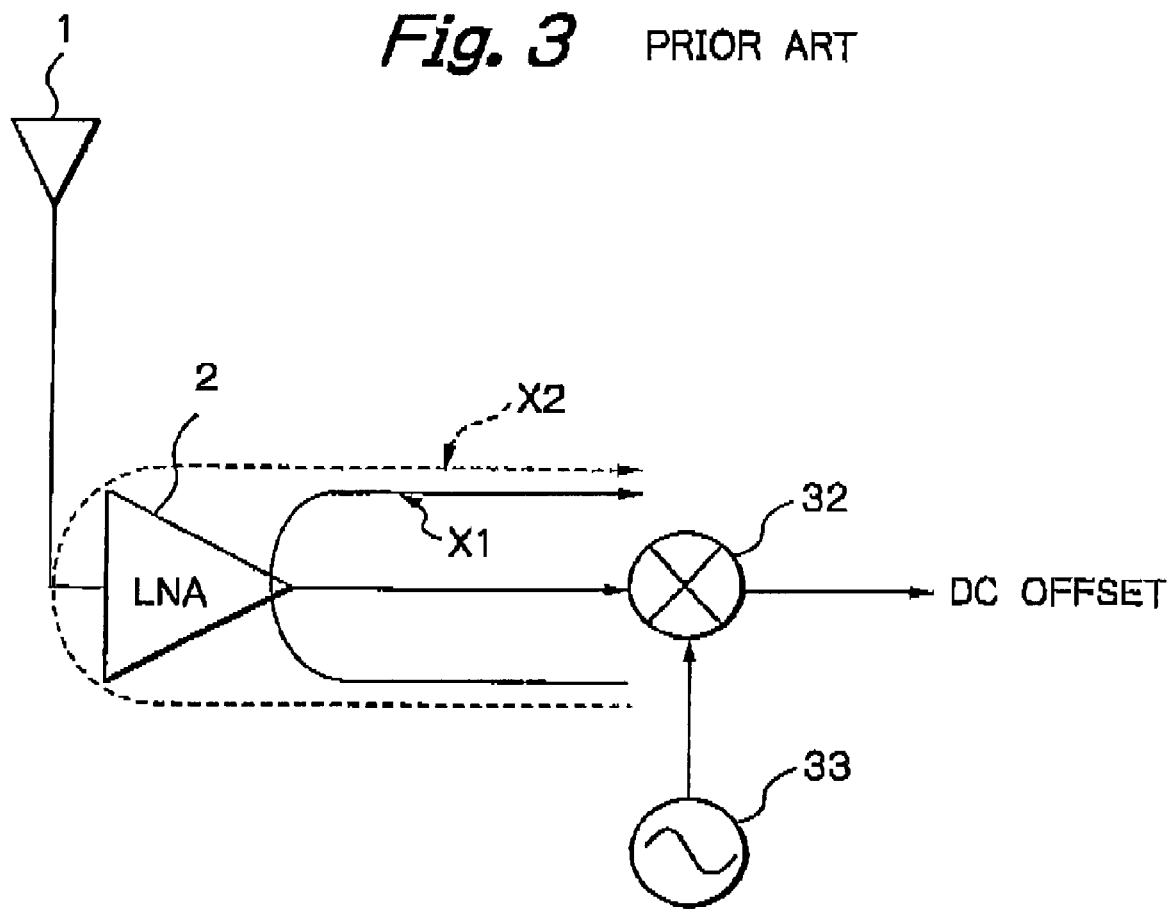
FIG. 3 is a circuit diagram for explaining a DC offset by the self-mixing phenomenon in FIG. 1.

① A DC offset may be generated. That is, a slight difference between the frequency $f_{RF}$ of the RF signal $u_{RF}$ and the frequency $f_{LO}$ of the local oscillator signal $u_{LO}$ appear as a DC offset at the output signal of each of the two-input mixers 31 and 32. Also, as illustrated in FIG. 3, the local oscillator signal $u_{LO}$ leaks from one input of the two-input mixer 32 (31) to the other input of the two-input mixer 32 (31). As a result, the leaked local oscillator signal is reflected at the output of the low noise amplifier 2 and at the antenna 1 as indicated by X1 and X2, respectively. The reflected local oscillator signals X1 and X2 are down-converted and result in a DC offset which is called a DC offset caused by the self-mixing phenomenon. Since the above-mentioned DC offset is not stable, the DC offset serves as a low frequency noise. In order to remove the DC offset, DC offset removing circuits are required, which is an obstacle in realizing one chip wireless receiver.

② Ad Since the frequency $f_{LO}$ of the local oscillator signal $u_{LO}$ coincides with the frequency $f_{RF}$ of the RF signal, the leakage of the local oscillator signal $u_{LO}$ within the wireless receiver of FIG. 1 generates trouble in reception sensitivity around the frequency $f_{RF}$.

③ Antenna radiation of the local oscillator signal $u_{LO}$ suppresses the reception sensitivity of other wireless receivers receiving RF signals using approximately the same frequency $f_{LO}$.

Figure 4:
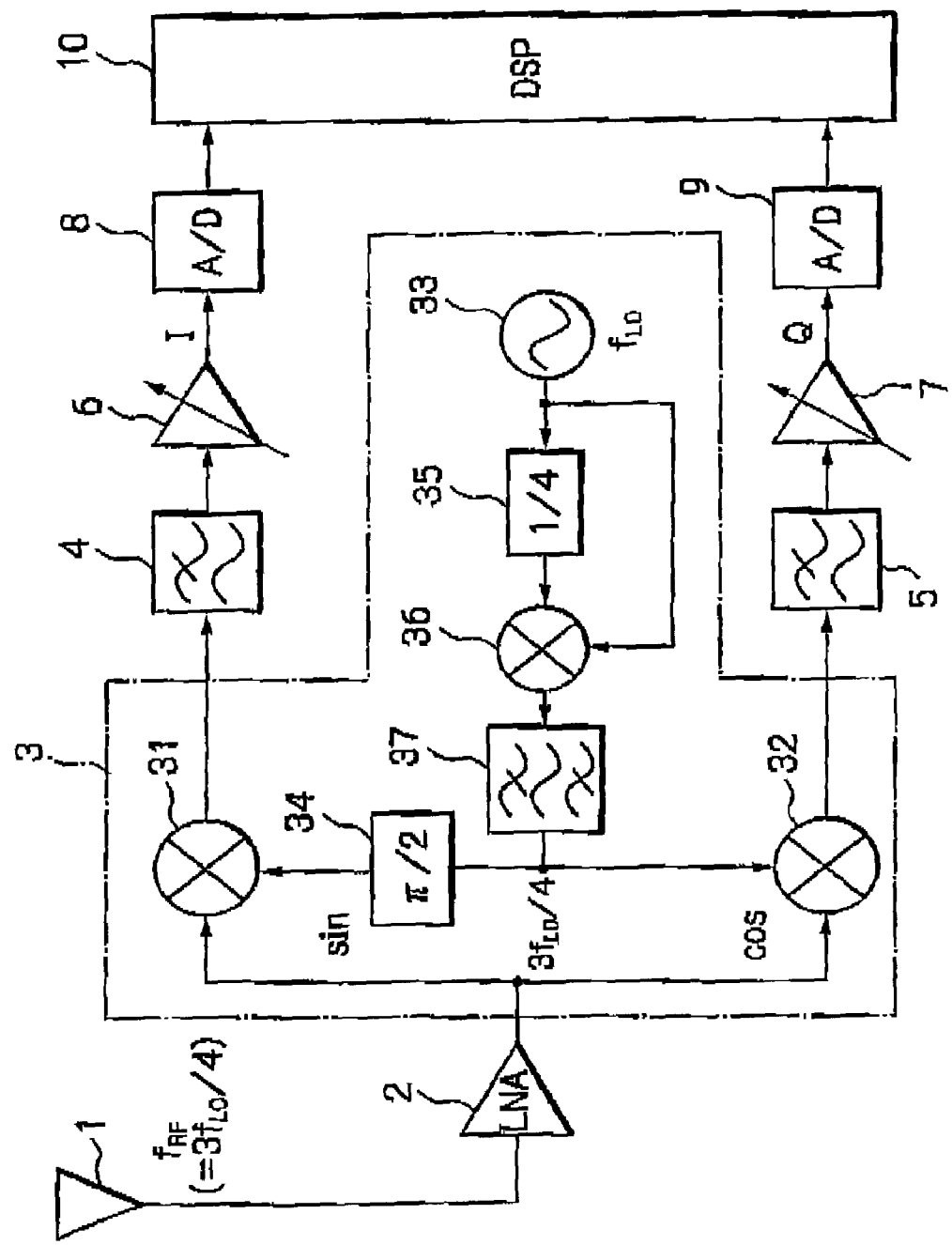
FIG. 4 is a circuit diagram illustrating a second prior art quadrature mixer circuit applied to a direct conversion type wireless receiver.

In FIG. 4, which illustrates a second prior art quadrature mixer circuit applied to a direct conversion type wireless receiver, a ¼-frequency divider 35, a two-input mixer 36 and a band-pass filter 37 are added to the elements of FIG. 1. That is, if the local oscillator signal $u_{LO}$ of the voltage controlled oscillator 33 is $f_{LO}$, a local oscillator signal having a frequency (¾) $f_{LO}$ is generated by the ¼-frequency divider 35, the two-input mixer 36 and the band-pass filter 37. Therefore, $$f_{RF} = (3/4)f_{LO}$$

As a result, the frequency $f_{LO}$ of the voltage controlled oscillator 33 is different from the frequency $f_{RF}$ of the RF signal.

Even in the direct conversion type wireless receiver of FIG. 4, since the frequency (¾) $f_{LO}$ at an input of the two-input mixer 31(32) is the same as that at the frequency $f_{RF}$ at another input of the two-input mixer 31(32), there are the same disadvantages as in the direct conversion type wireless receiver of FIG. 1.

Figure 5:
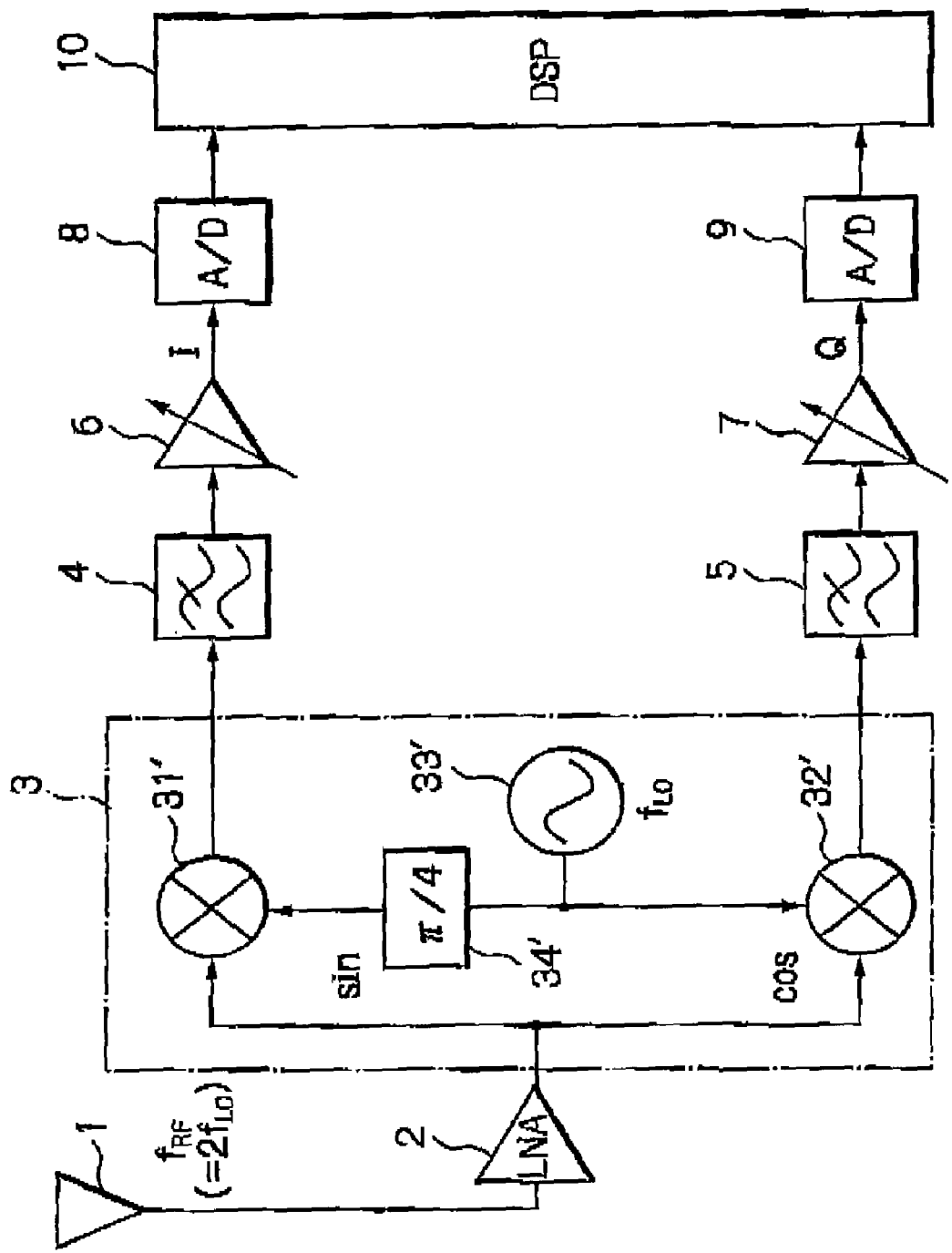
FIG. 5 is a circuit diagram illustrating a third prior art quadrature mixer circuit applied to a direct conversion type wireless receiver.

In FIG. 5, which illustrates a third prior art quadrature mixer circuit applied to a direct conversion type wireless receiver (see: JP-A-9-205382) & Takafumi Yamaji et al, "An I/Q Active Balanced Harmonic Mixer with IM2 Cancelers and a 45° Phase Shifter", IEEE Journal of Solid-State Circuits, Vol. 33, No. 12, pp. 2240–2246, December 1998), the quadrature mixer circuit 3 is constructed by two-input even-harmonic mixers 31' and 32', a voltage controlled oscillator 33' and a π/4 phase shifter 34'.

The principle of the two-input even-harmonic mixers 31' and 32' is explained below.

In the two-input even-harmonic mixers 31' and 32', a third-order term of the transfer characteristics of a non-linear element is used.

When an RF signal $u_{RF}$ having a frequency $f_{RF}$ and a local oscillator signal $u_{LO}$ having a frequency $f_{LO}$ are mixed at the non-linear element, the third-order term $a_3 u^3$ of the formula (1) is represented by $$a_3 u^3 = a_3(u_{RF} + u_{LO})^3 = a_3(u_{RF}^3 + u_{LO}^3 + 3u_{RF}^2 u_{LO} + 3u_{RF} u_{LO}^2) \quad (8)$$

The fourth term of the formula (8) is represented by $$3u_{RF} u_{LO}^2 = 3U_{RF} \cdot U_{LO}^2 \cdot \cos(2\pi f_{RF} t) \cos^2(2\pi f_{LO} t)$$
$$= 3U_{RF} \cdot U_{LO}^2 \cdot \cos(2\pi f_{RF} t)\{1 + \cos(4\pi f_{LO} t)\}/2$$
$$= 3U_{RF} \cdot U_{LO}^2 \cdot \{\cos(2\pi f_{RF} t) + \cos(2\pi f_{RF} t)\cos(4\pi f_{LO} t)\}/2 = 3U_{RF} \cdot U_{LO}^2[2\cos(2\pi f_{RF} t) + \cos\{2\pi(f_{RF} t - 2f_{LO})t\} + \cos\{2\pi(f_{RF} t + 2f_{LO})t\}]/4 \quad (9)$$

In such a down-conversion system of FIG. 5 where the two-input even-harmonic mixer 32' is followed by the low-pass filter 5, only the low frequency component $3U^{RF} \cdot U_{LO}^2 \cos\{2\pi(f_{RF} t - 2f_{LO})t\}$ in the formula (9) is obtained. Note that a difference $|f_{RF} - 2f_{LO}|$ is defined as an intermediate frequency $f_{IF}$.

If an ideal even-harmonic mixer has the same conversion gain in both frequencies $f_{RF}$, $f_{RF} - 2f_{LO}$ and $f_{RF} + 2f_{LO}$, the in-band noise power converted from the three bands around the frequencies $f_{RF}$, $f_{RF} - 2f_{LO}$ and $f_{RF} + 2f_{LO}$ is six-times ($=1/(2^2+1^2+1^2)$) from the formula (9) by squaring each amplitude thereof. Therefore, the noise figure (NF) of the ideal even-harmonic mixer becomes damaged by six, i.e., 7.78 dB, as compared with a circuit with a single-input signal and a single-output signal.

On the other hand, since the local oscillator signal $u_{LO}$ is supplied via the π/4 phase shifter 34' to the two-input even-harmonic mixer 31', a local oscillator signal $u_{LO}'$ supplied to the two-input even-harmonic mixer 31' is represented by $$u_{LO}' = u_{LO} \cdot \cos(2\pi f_{LO} t + \pi/4) \quad (10)$$

Therefore, the fourth-order term of the formula (8) is represented by $$3u_{RF} u_{LO}'^2 = 3U_{RF} \cdot U_{LO}^2 \cdot \cos(2\pi f_{RF} t)\cos^2(2\pi f_{LO} t + \pi/4)$$
$$= 3U_{RF} \cdot U_{LO}^2 \cdot \cos(2\pi f_{RF} t)\{1 + \cos(4\pi f_{LO} t + \pi/2)\}/2$$
$$= 3U_{RF} \cdot U_{LO}^2 \cdot \cos(2\pi f_{RF} t)\{1 - \sin(4\pi f_{LO} t)\}/2$$
$$= 3U_{RF} \cdot U_{LO}^2 \cdot \{\cos(2\pi f_{RF} t) - \cos(2\pi f_{RF} t)\sin(4\pi f_{LO} t)\}/2 = 3U_{RF} \cdot U_{LO}^2 \cdot [2\cos(2\pi f_{RF} t) + \sin\{2\pi(f_{RF} t - 2f_{LO})t\} + \sin\{2\pi(f_{RF} t + 2f_{LO})t\}]/4 \quad (11)$$

Thus, in a down-conversion system of FIG. 5 where the two-input even-harmonic mixer 31' is followed by the low-pass filter 4, the component $3U_{RF} \cdot U_{LO}^2 \cdot \sin\{2\pi(f_{RF} t - 2f_{LO})t\}$ of the formula (14) is obtained. Note that a difference $|f_{RF} t - 2f_{LO}|$ is also defined as an intermediate frequency $f_{IF}$.

In the quadrature mixer circuit 3 of FIG. 5, however, as stated in JP-A-9-205382, it is difficult to realize the π/4 phase shifter 34'.

Figure 6:
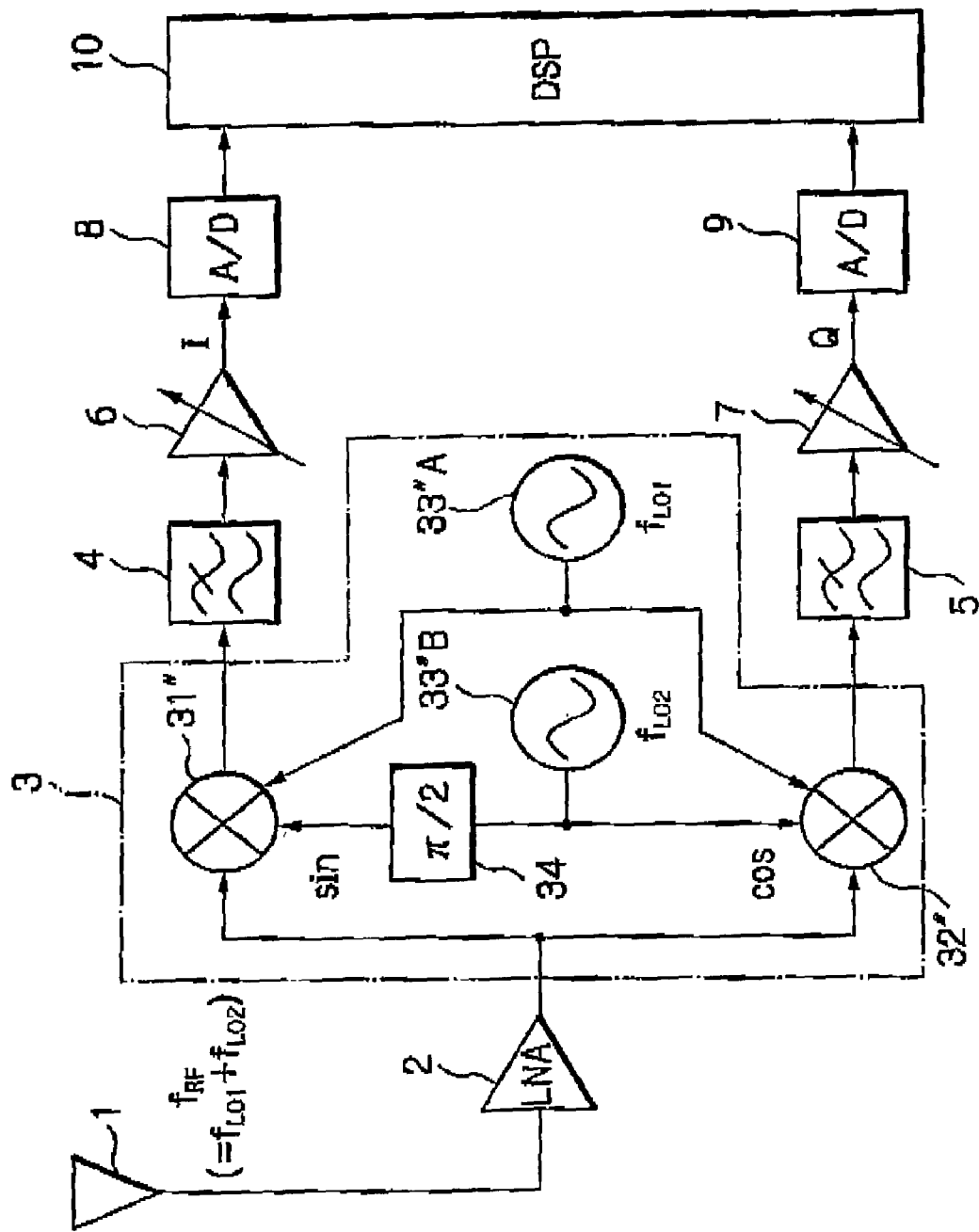
FIG. 6 is a block circuit diagram illustrating a first embodiment of the quadrature mixer circuit applied to a direct conversion type wireless receiver according to the present invention.

In FIG. 6, which illustrates a first embodiment of the quadrature mixer circuit applied to a direct conversion type wireless receiver according to the present invention, the two-input mixers 31 and 32 of FIG. 1 are replaced by three-input mixers 31" and 32", respectively, and the voltage controlled oscillator 33 of FIG. 1 is replaced by two voltage controlled oscillators 33"A and 33"B, which generate local oscillator signals $u_{LO1}$, and $u_{LO2}$ having frequencies $f_{LO1}$ and $f_{LO2}$, respectively. Note that each of the three-input mixers 31" and 32" can be constructed by a three-input multiplier (see: JP-A-10-105632).

In the three-input mixers 31" and 32", a third-order term of the transfer characteristics of a non-linear element is also used.

When the RF signal $U_{RF}$ having the frequency $f_{RF}$ and the local oscillator signals $u_{LO1}$ and $u_{LO2}$ having frequencies $f_{LO1}$ and $f_{LO2}$ are mixed at the non-linear element, the third-order term $a_3 u^3$ of the formula (1) is replaced by $$a_3 u^3 = a_3(u_{RF} + u_{LO1} + u_{LO2})^3 = a_3(u_{RF}^3 + u_{LO1}^3 + u_{LO2}^3 + 3u_{RF}^2 u_{LO1} + 3u_{RF}^2 u_{LO2} + 3u_{RF} u_{LO1}^2 + 3u_{LO1}^2 u_{LO2} + 3u_{RF} u_{LO2}^2 + 3u_{LO1} u_{LO2}^2 + 6u_{RF} u_{LO1} u_{LO2}) \quad (13)$$

In this case, the RF signal $u_{RF}$ and the local oscillator signals $u_{LO1}$ and $u_{LO2}$ are represented by $$u_{RF} = u_{RF} \cdot \cos(2\pi f_{RF} t) \quad (14)$$

$$u_{LO1} = u_{LO1} \cdot \cos(2\pi f_{LO1} t) \quad (15)$$

$$u_{LO2} = u_{LO2} \cdot \cos(2\pi f_{LO2} t) \quad (16)$$

Generally, the following triple product of trigonometric functions is known;

$$\cos\alpha \cos\beta \cos\gamma = \{\cos(\alpha+\beta-\gamma) + \cos(\beta+\gamma-\alpha) + \cos(\gamma+\alpha-\beta) + \cos(\alpha+\beta+\gamma)\}/4 \quad (17)$$

Therefore, the tenth term of the formula (13) is represented by $$6u_{RF} u_{LO1} u_{LO2} = 6U_{RF} \cdot U_{LO1} \cdot U_{LO2} \cdot \cos(2\pi f_{RF} t)\cos(2\pi f_{LO1} t)\cos(2\pi f_{LO2} t) = 3U_{RF} \cdot U_{LO1} \cdot U_{LO2} \cdot [\cos\{2\pi(f_{RF} + f_{LO1} - f_{LO2})t\} + \cos\{2\pi(-f_{RF} + f_{LO1} + f_{LO2})t\} + \cos\{2\pi(f_{RF} - f_{LO1} + f_{LO2})t\} + \cos\{2\pi(f_{RF} + f_{LO1} + f_{LO2})t\}]/2 \quad (18)$$

In such a down-conversion system of FIG. 6 where the three-input mixer 32" is followed by the low-pass filter 5, only the low frequency component $3U_{RF} \cdot U_{LO1} \cdot U_{LO2} \cos\{2\pi(-f_{RF} + f_{LO1} + f_{LO2})t\}$ in the equation (18) is obtained. Note that a difference $|f_{RF} - f_{LO1} - f_{LO2}|$ is defined as an intermediate frequency $f_{RF}$.

On the other hand, since the local oscillator signal $u_{LO2}$ is supplied via the π/2 phase shifter 34 to the three-input mixer 31", a local oscillator signal $u_{LO2}'$ supplied to the three-input mixer 31" is represented by $$u_{LO2}' = U_{LO2} \sin(2\pi f_{LO2} t) \quad (19)$$

Generally, the following triple product of trigonometric functions is known:

$$\sin\alpha \cos\beta \cos\gamma = \{\sin(\alpha+\beta-\gamma)+\sin(\beta+\gamma-\alpha)+\sin(\gamma+\alpha-\beta)-\sin(\alpha+\beta+\gamma)\}/4 \quad (20)$$

Therefore, the tenth term of the formula (13) is represented by $$6u_{RF} u_{LO1} u_{LO2} = 6U_{RF} \cdot U_{LO1} \cdot U_{LO2} \cdot \cos(2\pi f_{RF} t)\cos(2\pi f_{LO1} t)\sin(2\pi f_{LO2} t) = 3U_{RF} \cdot U_{LO1} \cdot U_{LO2} \cdot [\sin\{2\pi (f_{RF}+f_{LO1}-f_{LO2})t\}+\sin\{2\pi(-f_{RF}+f_{LO1}+f_{LO2})t\}+\sin\{2\pi(f_{RF}-f_{LO1}+f_{LO2})t\}+\sin\{2\pi(f_{RF}+f_{LO1}+f_{LO2})t\}]/2 \quad (21)$$

Thus, in a down-conversion system of FIG. 6 where the three-input mixer 31" is followed by the low-pass filter 4, the component $3U_{RF} \cdot U_{LO1} \cdot U_{LO2} \cdot \sin\{2\pi(f_{RF}+f_{LO1}+f_{LO2})t\}$ of the formula (21) is obtained. Note that a difference $|f_{RF}-f_{LO1}-f_{LO2}|$ is also defined as an intermediate frequency $f_{IF}$.

Figure 7:
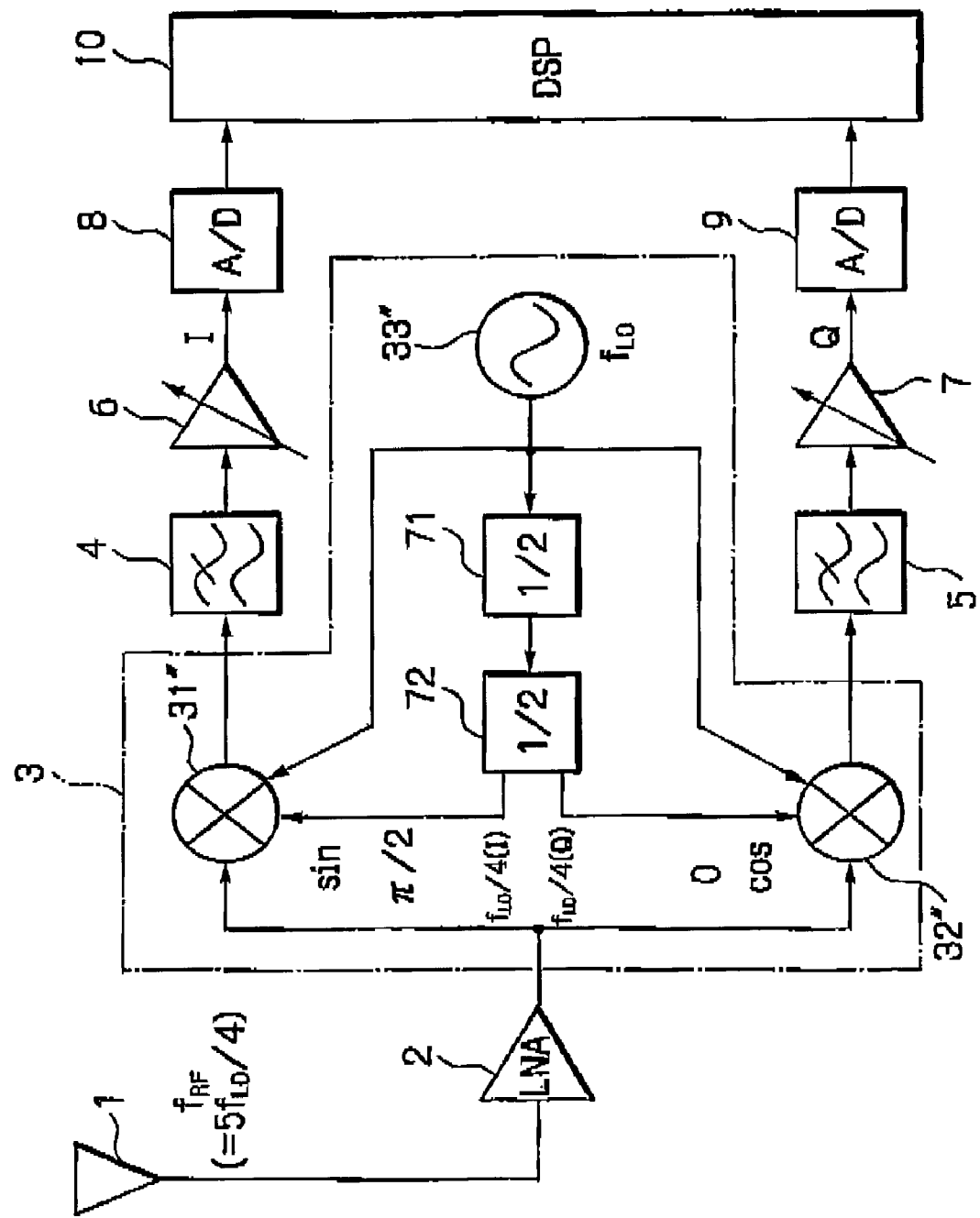
FIG. 7 is a block circuit diagram illustrating a second embodiment of the quadrature mixer circuit applied to a direct conversion type wireless receiver according to the present invention.

In FIG. 7, which illustrates a second embodiment of the quadrature mixer circuit applied to a direct conversion type wireless receiver according to the present invention, the voltage controlled oscillators 33"A and 33"B and the $\pi/2$ phase shifter 34 of FIG. 6 are replaced by a voltage controlled oscillator 33" and a Johnson counter formed by two ½-frequency dividers 71 and 72. In this case, the Johnson counter generates local oscillator signals $u_{LO/4}$ and $u_{LO/4}'$ out of phase by $\pi/2$.

In the three-input mixers 31" and 32", $\sin\{2\pi(f_{RF}-f_{LO1}-f_{LO2})t\}$ of the formula (21) is also used.

When the RF signal $U_{RF}$ having the frequency $f_{RF}$ and the local oscillator signals $u_{LO}$ and $u_{LO/4}$ having frequencies $f_{LO}$ and $f_{LO/4}$ are mixed at the non-linear element, the third-order term $a_3 u^3$ of the formula (1) is replaced by $$a_3 u^3 = a_3(u_{RF}+u_{LO}+u_{LO/4})^3 = a_3(u_{RF}^3+u_{LO}^3+u_{LO/4}^3+3u_{RF}^2 u_{LO}+3u_{RF}^2 u_{LO/4}+3u_{RF} u_{LO}^2+3u_{LO}^2 u_{LO/4}+3u_{RF} u_{LO/4}^2+3u_{LO} u_{LO/4}^2+6u_{RF} u_{LO} u_{LO/4}) \quad (22)$$

In this case, the local oscillator signal $u_{LO/4}$ is represented by $$u_{LO/4} = u_{LO/4} \cdot \cos\{2\pi(f_{LO}/4)t\} \quad (23)$$

Therefore, the tenth term of the formula (22) is represented by $$6u_{RF} u_{LO} u_{LO/4} = 6U_{RF} \cdot U_{LO} \cdot U_{LO/4} \cdot \cos(2\pi f_{RF} t)\cos(2\pi f_{LO} t)\cos\{2\pi(f_{LO}/4)t\} = 3U_{RF} \cdot U_{LO} \cdot U_{LO/4} \cdot [\cos\{2\pi(f_{RF}-5f_{LO}/4)t\}+\cos\{2\pi(f_{RF}-3f_{LO}/4)t\}+\cos\{2\pi(f_{RF}+5f_{LO}/4)t\}+\cos\{2\pi(f_{RF}+3f_{LO}/4)t\}]/2 \quad (24)$$

In such a down-conversion system of FIG. 7 where the three-input mixer 32" is followed by the low-pass filter 5, only the low frequency component $3U_{RF} \cdot U_{LO} \cdot U_{LO/4} \cdot \cos\{2\pi(-f_{RF}+5f_{LO}/4)t\}$ in the equation (24) is obtained. Note that a difference $|f_{RF}-5f_{LO}/4|$ is defined as an intermediate frequency $f_{RF}$.

On the other hand, the local oscillator signal $u_{LO/4}'$ supplied to the three-input mixer 31" is represented by $$u_{LO4}' U_{LO/4} \cdot \sin\{2\pi(f_{LO}/4)t\} \quad (25)$$

Therefore, the tenth term of the formula (24) is represented by $$6u_{RF} u_{LO} u_{LO/4} = 6U_{RF} \cdot U_{LO} \cdot U_{LO/4} \cdot \cos(2\pi f_{RF} t)\cos(2\pi f_{LO} t)\sin\{2\pi(f_{LO}/4)t\} = 3U_{RF} \cdot U_{LO} \cdot U_{LO/4} \cdot [\sin\{2\pi(f_{RF}-5f_{LO}/4)t\}+\sin\{2\pi(f_{RF}-3f_{LO}/4)t\}+\sin\{2\pi(f_{RF}+5f_{LO}/4)t\}+\sin\{2\pi(f_{RF}+3f_{LO}/4)t\}]/2 \quad (26)$$

Thus, in a down-conversion system of FIG. 7 where the three-input mixer 31" is followed by the low-pass filter 4, the component $3U_{RF} \cdot U_{LO1} \cdot U_{LO2} \cdot \sin\{2\pi(f_{RF}-5f_{LO}/4)t\}$ of the formula (26) is obtained. Note that a difference $|f_{RF}-5f_{LO}/4|$ is also defined as an intermediate frequency $f_{IF}$.

Figure 8A:
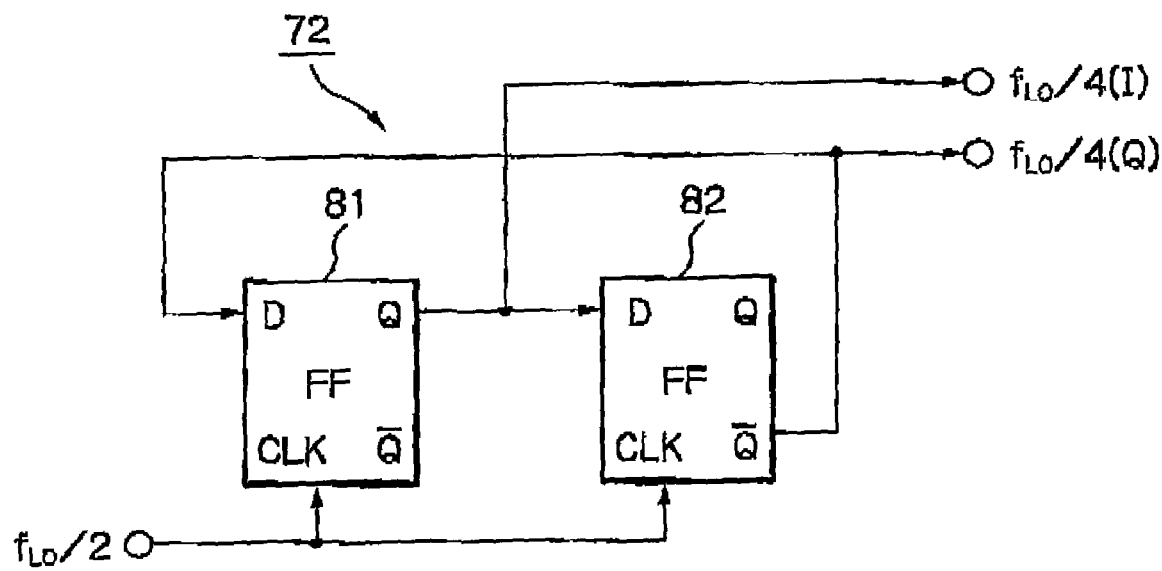
FIG. 8A is a detailed circuit diagram of the post stage of the Johnson counter of FIG. 7.
Figure 8B:
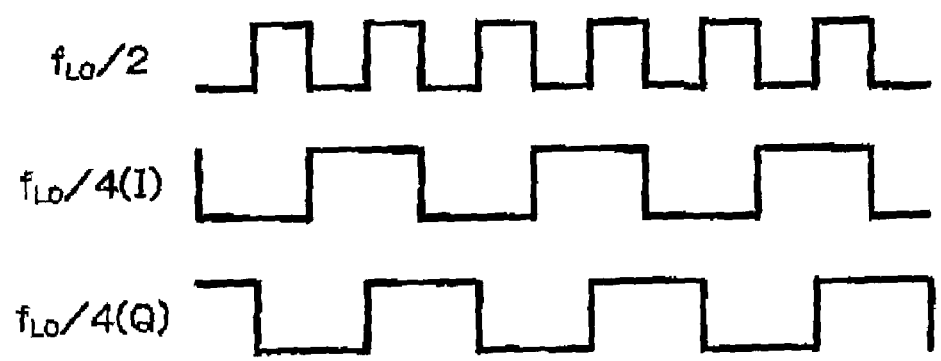
FIG. 8B is a waveform diagram showing the input and output signals of the post stage of the Johnson counter of FIG. 8A.

FIG. 8A is a detailed circuit diagram of the post stage of the Johnson counter of FIG. 7 and FIG. 8B is a waveform diagram showing the input and output signals of the post stage of the Johnson counter of FIG. 8A. That is, the post stage counter 72 is constructed by D-type flip-flops connected in series, so that the local oscillator signals $U_{LO/4}$ and $U_{LO/4}'$ having the same frequencies $f_{LO}/4(I)$ and $f_{LO}/4(Q)$ are obtained from a signal having a frequency $f_{LO}/2$.

The three-input mixers 31" and 32" can be constructed by doubly-polarity switching mixers instead of the three-input multipliers. Doubly-polarity switching mixers other than the three-input multipliers are easily integrated into one chip.

A typical doubly-polarity switching mixer will be explained next with reference to FIGS. 9, 10A, 10B, 11A, 11B, 12, 13, 14A, 14B, 15A and 15B.

Figure 9:
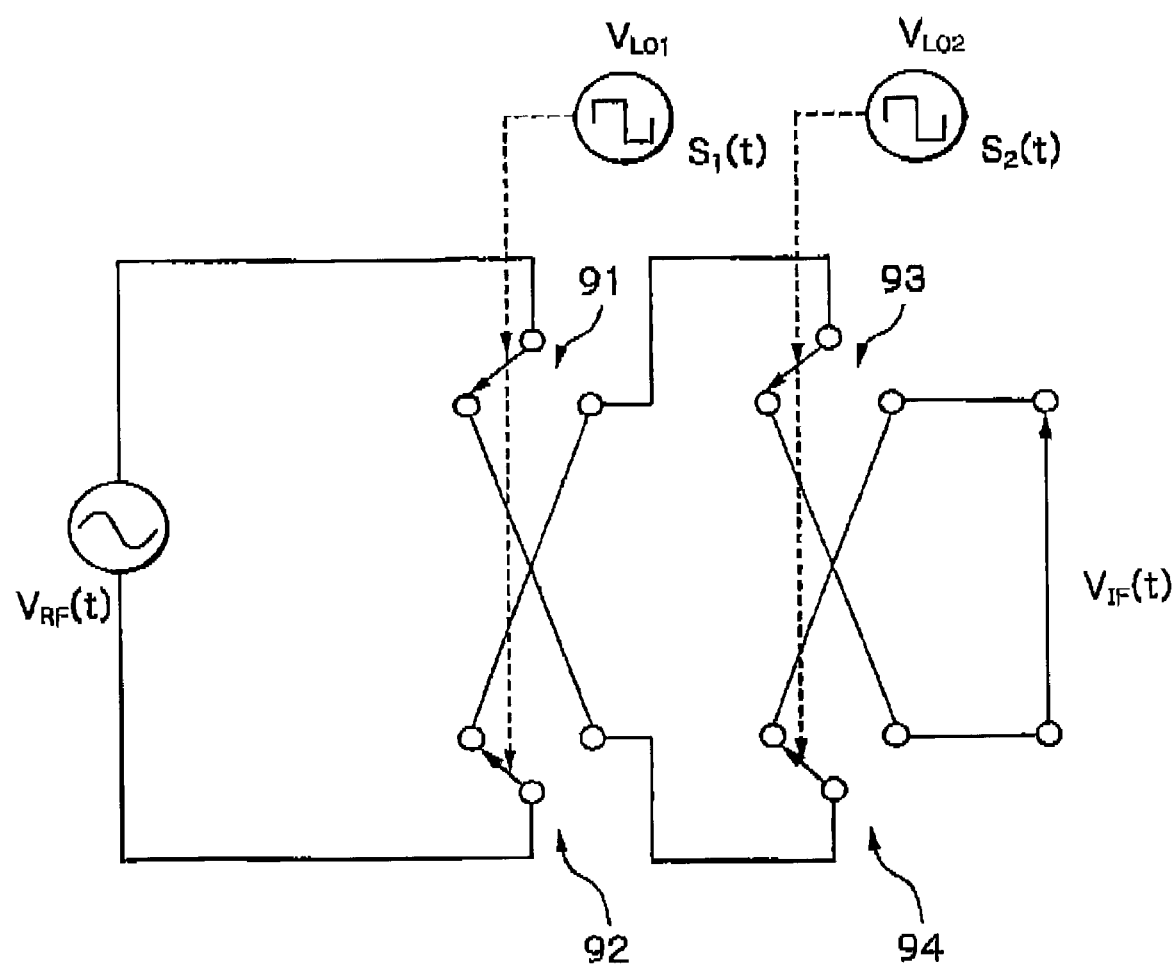
FIG. 9 is a circuit diagram of a doubly-polarity switching mixer used as each of the three-input mixers of FIGS. 6 and 7.

In FIG. 9, which is a circuit diagram of the doubly-polarity switching mixer, an RF signal $V_{RF}(t)$ is switched by two rectangular local oscillator signals $S_1(t)$ and $S_2(t)$. That is, switches 91, 92, 93 and 94 controlled by the local oscillator signals $S_1(t)$ and $S_2(t)$ receive the RF signal $V_{RF}(t)$ to generate an intermediate frequency signal $V_{IF}$. If the local oscillator signal $S_1(t)$ has an amplitude of $\pm U_{LO1}$ and a frequency of $f_{LO1}$ and the local oscillator signal $S_2(t)$ has an amplitude of $\pm U_{LO2}$ and a frequency of $f_{LO2}$, $S_1(t)$ and $S_2(t)$ are represented by $$S_1(t) = U_{LO1}(4/\pi)[\cos(2\pi f_{LO1} t)-(\tfrac{1}{3})\cos(6\pi f_{LO1} t)+(\tfrac{1}{5})\cos(10\pi f_{LO1} t)-(\tfrac{1}{7})\cos(14\pi f_{LO1} t)+\ldots] \quad (27)$$

$$S_2(t) = U_{LO2}(4/\pi)[\cos(2\pi f_{LO2} t)-(\tfrac{1}{3})\cos(6\pi f_{LO2} t)+(\tfrac{1}{5})\cos(10\pi f_{LO2} t)-(\tfrac{1}{7})\cos(14\pi f_{LO2} t)+\ldots] \quad (28)$$

Also, if $S_1(t) = U_{LO1} \text{sgn}(S_1(t))$ and $S_2(t) = U_{LO2} \text{sgn}(S_2(t))$, $$V_{IF}(t) = u_{RF} \cdot U_{LO1} \text{sgn}(S_1(t)) U_{LO2} \text{sgn}(S_2(t)) \quad (29)$$

$$u_{RF} = U_{RF} \cos(2\pi f_{RF} t) \quad (30)$$

Therefore, $$V_{IF}(t) = u_{RF} \cdot U_{LO1} \text{sgn}(S_1(t)) U_{LO2} \text{sgn}(S_2(t)) = u_{RF} \cos(2\pi f_{RF} t) U_{LO1} \text{sgn}(S_1(t)) U_{LO2} \text{sgn}(S_2(t)) \quad (31)$$

Since $\text{sgn}(S_1(t))$ and $\text{sgn}(S_2(t))$ are $-1$ and $+1$, and $-1$ and $+1$, respectively, their absolute values are represented by $$|\text{sgn}(S_1(t))| = 1 \quad (32)$$

$$|\text{sgn}(S_2(t))| = 1 \quad (33)$$

Therefore, $\text{sgn}(S_1(t))$ and $\text{sgn}(S_2(t))$ are represented by $$\text{sgn}(S_1(t)) = (4/\pi)[\cos(2\pi f_{LO1} t)-(\tfrac{1}{3})\cos(6\pi f_{LO1} t)+(\tfrac{5}{1})\cos(10\pi f_{LO1} t)-(\tfrac{1}{7})\cos(14\pi f_{LO1} t)+\ldots] \quad (34)$$

$$\text{sgn}(S_2(t)) = (4/\pi)[\cos(2\pi f_{LO2} t)-(\tfrac{1}{3})\cos(6\pi f_{LO2} t)+(\tfrac{5}{1})\cos(10\pi f_{LO2} t)-(\tfrac{1}{7})\cos(14\pi f_{LO2} t)+\ldots] \quad (35)$$

Thus, the formula (31) is represented by $$V_{IF}(t) = u_{RF} \cdot U_{LO1} \text{sgn}(S_1(t)) \cdot U_{LO2} \text{sgn}(S_2(t)) \quad (36)$$

$$= U_{RF} \cdot U_{LO1} \cdot U_{LO2} \cdot \cos(2\pi f_{RF} t) \cdot \text{sgn}(S_1(t)) \cdot \text{sgn}(S_2(t))$$

$$= (16/\pi^2) U_{RF} \cdot U_{LO1} \cdot U_{LO2} \cdot \cos(2\pi f_{RF} t) \big[\cos(2\pi f_{LO1} t) -$$

$$(1/3)\cos(6\pi f_{LO1} t) + (1/5)\cos(10\pi f_{LO1} t) -$$

$$(1/7)\cos(14\pi f_{LO1} t) + \cdots\big] \cdot \big[\cos(2\pi f_{LO2} t) -$$

$$(1/3)\cos(6\pi f_{LO2} t) + (1/5)\cos(10\pi f_{LO2} t) -$$

-continued $$(1/7)\cos(14\pi f_{LO2}t) + \cdots]$$

$$= (16/\pi^2)U_{RF} \cdot U_{LO1} \cdot U_{LO2} \cdot$$

$$[\cos(2\pi f_{RF}t)\cos(2\pi f_{LO1}t)\cos(2\pi f_{LO2}t) +$$

$$(1/9)\cos(2\pi f_{RF}t)\cos(6\pi f_{LO1}t)\cos(6\pi f_{LO2}t) +$$

$$(1/25)\cos(2\pi f_{RF}t)\cos(10\pi f_{LO1}t)\cos(10\pi f_{LO2}t) +$$

$$(1/49)\cos(2\pi f_{RF}t)\cos(14\pi f_{LO1}t)\cos(14\pi f_{LO2}t) -$$

$$(1/3)\{\cos(2\pi f_{RF}t)\cos(6\pi f_{LO1}t)\cos(2\pi f_{LO2}t) +$$

$$\cos(2\pi f_{RF}t)\cos(2\pi f_{LO1}t)\cos(6\pi f_{LO2}t)\} +$$

$$(1/5)\{\cos(2\pi f_{RF}t)\cos(10\pi f_{LO1}t)\cos(2\pi f_{LO2}t) +$$

$$\cos(2\pi f_{RF}t)\cos(2\pi f_{LO1}t)\cos(10\pi f_{LO2}t)\} -$$

$$(1/7)\{\cos(2\pi f_{RF}t)\cos(14\pi f_{LO1}t)\cos(2\pi f_{LO2}t) +$$

$$\cos(2\pi f_{RF}t)\cos(2\pi f_{LO1}t)\cos(14\pi f_{LO2}t)\} -$$

$$(1/15)\{\cos(2\pi f_{RF}t)\cos(6\pi f_{LO1}t)\cos(10\pi f_{LO2}t) +$$

$$\cos(2\pi f_{RF}t)\cos(10\pi f_{LO1}t)\cos(6\pi f_{LO2}t)\} -$$

$$(1/21)\{\cos(2\pi f_{RF}t)\cos(6\pi f_{LO1}t)\cos(14\pi f_{LO2}t) +$$

$$\cos(2\pi f_{RF}t)\cos(14\pi f_{LO1}t)\cos(6\pi f_{LO2}t)\} -$$

$$(1/35)\{\cos(2\pi f_{RF}t)\cos(10\pi f_{LO1}t)\cos(14\pi f_{LO2}t) +$$

$$\cos(2\pi f_{RF}t)\cos(14\pi f_{LO1}t)\cos(10\pi f_{LO2}t)\} + \cdots]$$

Apparent from the formula (36), when the RF signal $U_{RF}$ is switched by the polarities of the local oscillator signals $S_1(t)$ and $S_2(t)$, basic waves and harmonic waves of the three signals are obtained.

For example, four frequency components such as $\cos\{2\pi(f_{RF}-f_{LO1}-f_{LO2})t\}$, $\cos\{2\pi(f_{RF}-f_{LO1}+f_{LO2})t\}$, $\cos\{2\pi(f_{RF}+f_{LO1}+f_{LO2})t\}$ and $\cos\{2\pi(f_{RF}+f_{LO1}-f_{LO2})t\}$ are obtained from the triple product $\cos(2\pi f_{RF}t)\cos(2\pi f_{LO1}t)\cos(2\pi f_{LO2}t)$ of basic waves with reference to the formula of triple product of trigonometric functions shown in the formula (17).

In this case, if the doubly-polarity switching mixer of FIG. 9 constitutes a down-conversion system where a low-pass filter follows this doubly-polarity switching mixer, only the low frequency component $\cos\{2\pi(f_{RF}-f_{LO1}-f_{LO2})t\}$ is obtained. Note that a difference $|f_{LO1}-f_{LO2}|$ is defined as an intermediate frequency $f_{IF}$.

Also, four frequency components such as $\cos[2\pi\{f_{RF}-(2m+1)f_{LO1}-(2m'+1)f_{LO2}\}t]$, $\cos[2\pi\{f_{RF}-(2m+1)f_{LO1}+(2m'+1)f_{LO2}\}t]$, $\cos[2\pi\{f_{RF}+(2m+1)f_{LO1}+(2m'+1)f_{LO2}\}t]$ and $\cos[2\pi\{f_{RF}+(2m+1)f_{LO1}-(2m'+1)f_{LO2}\}t]$ are obtained from triple products $\cos(2\pi f_{RF}t)\cos\{2\pi(2m+1)f_{LO1}t\}\cos\{2\pi(2m'+1)f_{LO2}t\}$ (m, m'=1, 2, . . . ) of the RF signal $V_{RF}(t)$ and the odd-higher harmonic waves of the local oscillator signals $S_1(t)$ and $S_2(t)$ with reference to the formula of triple product of trigonometric functions shown in the formula (17). In this case, these triple products decay with a coefficient of $1/\{(2m+1)(2m'+1)\}$. Also, the frequencies of these triple products are on the odd-higher order. For example, when $f_{LO1}=2nf_{LO2}$ (n=2, 3, . . . ) and $f_{RF}=f_{LO1}+f_{LO2}$, the closest frequency is $7f_{LO1}/4$. Here, if $f_{LO2}=f_{LO1}/2$ and m=m'=1, $3f_{LO1}/2=f_{RF}$.

If an ideal doubly-polarity switching mixer has the same conversion gain in frequencies $f_{RF}\pm if_{LO1}\pm jf_{LO2}$, the in-band noise power converted from all bands around the frequencies $f_{RF}\pm if_{LO1}\pm jf_{LO2}$ is about six times $(=4(1/1^2+1/3^2+1/5^2+ \ldots)(1/1^2+1/3^2+1/5^2+ \ldots)=\pi^4/16=6.088)$ from the formula (36). Note $1/1^2+1/3^2+1/5^2+ \ldots +1/(2i+1)^2+ \ldots \pi^2/8$. Therefore, the noise figure (NF) of the ideal doubly-polarity switching mixer becomes damaged by 6.088, i.e., 7.844 dB, as compared with a circuit with a single-input signal and a single-output signal.

On the other hand, when a local oscillator signal $S_2'(t)$ out of phase by $\pi/2$ from the local oscillator signal $S_2(t)$ instead of the local oscillator signal $S_2(t)$ is input to the doubly-polarity switching mixer of FIG. 9, the formulae (27), (28), (34) and (35) are replaced by $$S_1(t)=U_{LO1}(4/\pi)[\cos(2\pi f_{LO1}t)-(1/3)\cos(6\pi f_{LO1}t)+(1/5)\cos(10\pi f_{LO1}t)-(1/7)\cos(14\pi f_{LO1}t)+ \ldots ] \quad (37)$$

$$S_2(t)'U_{LO2}(4/\pi)[\sin(2\pi f_{LO2}t)+(1/3)\sin(6\pi f_{LO2}t)+(1/5)\sin(10\pi f_{LO2}t)+(1/7)\sin(14\pi f_{LO2}t)+ \ldots ] \quad (38)$$

$$sgn(S_1(t))=(4/\pi)[\cos(2\pi f_{LO1}t)-(1/3)\cos(6\pi f_{LO1}t)+(5/1)\cos(10\pi f_{LO1}t)-(1/7)\cos(14\pi f_{LO1}t)+ \ldots ] \quad (39)$$

$$sgn(S_2(t)')=(4/\pi)[-\sin(2\pi f_{LO2}t)+(1/3)\sin(6\pi f_{LO2}t)-(5/1)\sin(10\pi f_{LO2}t)+(1/7)\sin(14\pi f_{LO2}t)+ \ldots ] \quad (40)$$

Therefore, the formula (31) is represented by $$V_{IF}(t) = u_{RF} \cdot U_{LO1} \cdot sgn(S_1(t)) \cdot U_{LO2} \cdot sgn(S_2'(t)) \quad (41)$$

$$= U_{RF} \cdot \cos(2\pi f_{RF}t) U_{LO1} \cdot sgn(S_1(t)) U_{LO2} \cdot sgn(S_2(t))$$

$$= (16/\pi^2)U_{RF} \cdot U_{LO1} \cdot U_{LO2} \cdot \cos(2\pi f_{RF}t)\big[\cos(2\pi f_{LO1}t) -$$

$$(1/3)\cos(6\pi f_{LO1}t) + (1/5)\cos(10\pi f_{LO1}t) -$$

$$(1/7)\cos(14\pi f_{LO1}t) + \cdots\big] \times \big[-\sin(2\pi f_{LO2}t) +$$

$$(1/3)\sin(6\pi f_{LO2}t) - (1/5)\sin(10\pi f_{LO2}t) +$$

$$(1/7)\sin(14\pi f_{LO2}t) + \cdots\big]$$

$$= -(16/\pi^2)U_{RF} \cdot U_{LO1} \cdot U_{LO2} \cdot$$

$$[\cos(2\pi f_{RF}t)\cos(2\pi f_{LO1}t)\sin(2\pi f_{LO2}t) +$$

$$(1/9)\cos(2\pi f_{RF}t)\cos(6\pi f_{LO1}t)\sin(6\pi f_{LO2}t) +$$

$$(1/25)\cos(2\pi f_{RF}t)\cos(10\pi f_{LO1}t)\sin(10\pi f_{LO2}t) +$$

$$(1/49)\cos(2\pi f_{RF}t)\cos(14\pi f_{LO1}t)\sin(14\pi f_{LO2}t) -$$

$$(1/3)\{\cos(2\pi f_{RF}t)\cos(6\pi f_{LO1}t)\sin(2\pi f_{LO2}t) +$$

$$\cos(2\pi f_{RF}t)\cos(2\pi f_{LO1}t)\sin(6\pi f_{LO2}t)\} +$$

$$(1/5)\{\cos(2\pi f_{RF}t)\cos(10\pi f_{LO1}t)\sin(2\pi f_{LO2}t) +$$

$$\cos(2\pi f_{RF}t)\cos(2\pi f_{LO1}t)\sin(10\pi f_{LO2}t)\} -$$

$$(1/7)\{\cos(2\pi f_{RF}t)\cos(14\pi f_{LO1}t)\sin(2\pi f_{LO2}t) +$$

$$\cos(2\pi f_{RF}t)\cos(2\pi f_{LO1}t)\sin(14\pi f_{LO2}t)\} -$$

$$(1/15)\{\cos(2\pi f_{RF}t)\cos(6\pi f_{LO1}t)\sin(10\pi f_{LO2}t) +$$

$$\cos(2\pi f_{RF}t)\cos(10\pi f_{LO1}t)\sin(6\pi f_{LO2}t)\} -$$

$$(1/21)\{\cos(2\pi f_{RF}t)\cos(6\pi f_{LO1}t)\sin(14\pi f_{LO2}t) +$$

$$\cos(2\pi f_{RF}t)\cos(14\pi f_{LO1}t)\sin(6\pi f_{LO2}t)\} -$$

$$(1/35)\{\cos(2\pi f_{RF}t)\cos(10\pi f_{LO1}t)\sin(14\pi f_{LO2}t) +$$

$$\cos(2\pi f_{RF}t)\cos(14\pi f_{LO1}t)\sin(10\pi f_{LO2}t)\} + \cdots]$$

From the formula (41), when the RF signal $U_{RF}$ is switched by the polarities of the local oscillator signals $S_1(t)$ and $S_2'(t)$, basic waves and harmonic waves of the three signals are obtained.

For example, four frequency components such as $\sin\{2\pi(f_{RF}-f_{LO1}-f_{LO2})t\}$, $\sin\{2\pi(f_{RF}-f_{LO1}+f_{LO2})t\}$, $\sin\{2\pi(f_{RF}+f_{LO1}+f_{LO2})t\}$ and $\sin\{2\pi(f_{RF}+f_{LO1}-f_{LO2})t\}$ are obtained from the triple product $\cos(2\pi f_{RF}t)\cos(2\pi f_{LO1}t)\sin(2\pi f_{LO2}t)$ of basic waves with reference to the formula of triple product of trigonometric functions shown in the formula (17).

In this case, if the doubly-polarity switching mixer of FIG. 9 constitutes a down-conversion system where a low-pass filter follows this doubly-polarity switching mixer, only the low frequency component $\sin\{2\pi(f_{RF}-f_{LO1}-f_{LO2})t\}$ is obtained. Note that a difference $|f_{LO1}-f_{LO2}|$ is defined as an intermediate frequency $f_{IF}$.

Also, four frequency components such as $\sin[2\pi\{f_{RF}-(2m+1)f_{LO1}-(2m'+1)f_{LO2}\}t]$, $\sin[2\pi\{f_{RF}-(2m+1)f_{LO1}+(2m'+1)f_{LO2}\}t]$, $\sin[2\pi\{f_{RF}+(2m+1)f_{LO1}+(2m'+1)f_{LO2}\}t]$ and $\sin[2\pi\{f_{RF}+(2m+1)f_{LO1}-(2m'+1)f_{LO2}\}t]$ are obtained from triple products $\cos(2\pi f_{RF}t)\cos\{2\pi(2m+1)f_{LO1}t\}\sin\{2\pi(2m'+1)f_{LO2}t\}$ (m, m'=1, 2, . . . ) of the RF signal $V_{RF}(t)$ and the odd-higher harmonic waves of the local oscillator signals $S_1(t)$ and $S_2(t)$ with reference to the formula of triple product of trigonometric functions shown in the formula (17). In this case, these triple products decay with a coefficient of $1/\{(2m+1)(2m'+1)\}$. Also, the frequencies of these triple products are on the odd-higher order. For example, when $f_{LO1}=2nf_{LO2}$ (n=2, 3, . . . ) and $f_{RF}=f_{LO1}+f_{LO2}$, the closest frequency is $7f_{LO2}/4$. Here, if $f_{LO2}=f_{LO1}/2$ and m=m'=1, $3f_{LO1}/2=f_{RF}$.

Figure 10A:
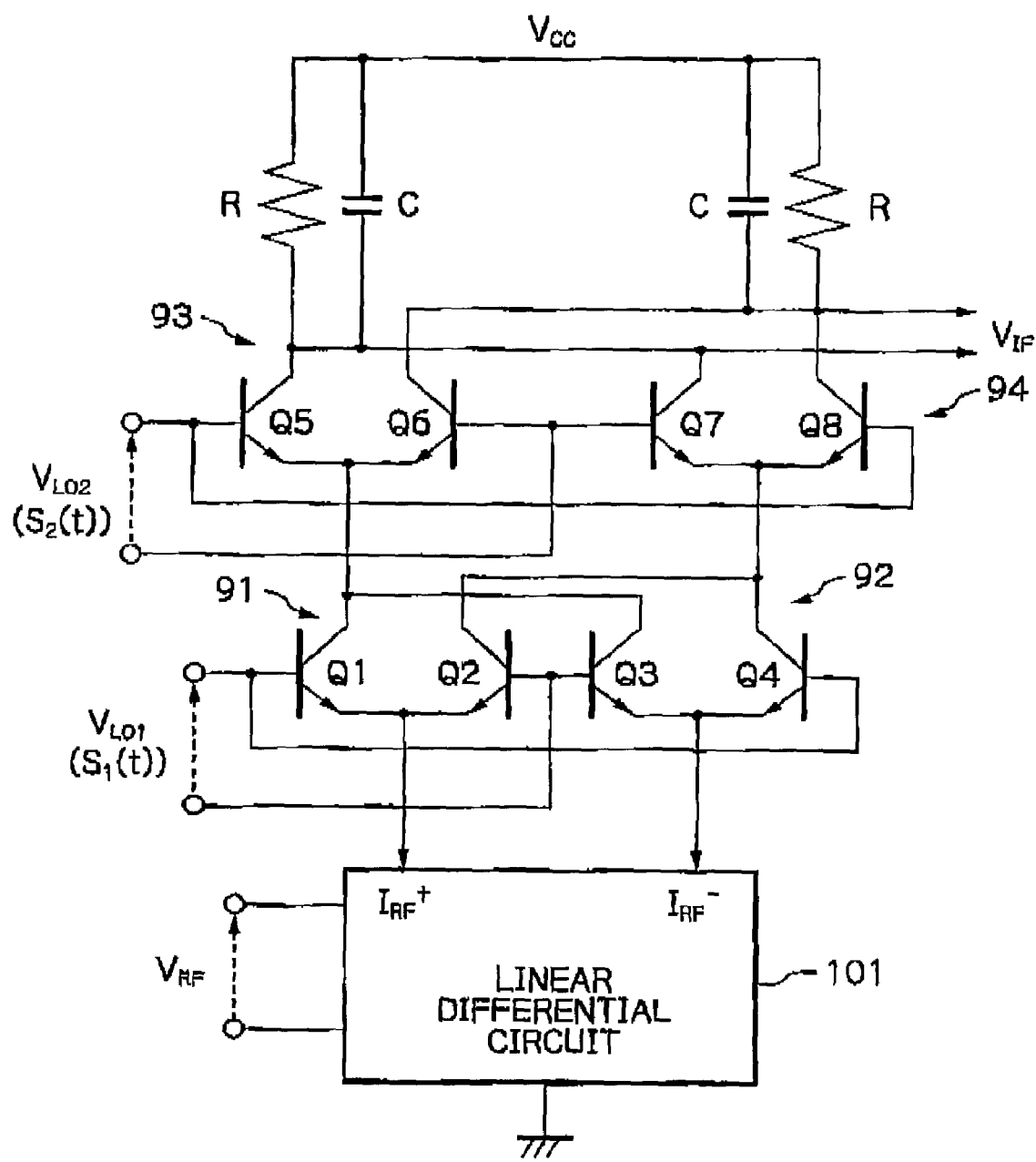
FIG. 10A is a detailed circuit diagram of the doubly-polarity switching mixer of FIG. 9.

In FIG. 10A, which illustrates a detailed circuit diagram of the doubly-polarity switching mixer of FIG. 9, each of the switches 91, 92, 93 and 94 are constructed by emitter-coupled pairs (current switches) of bipolar transistors Q1, Q2; Q3, Q4; Q5, Q6; and Q7, Q8. In this case, one of the transistors Q1 and Q2, one of the transistors Q3 and Q4, one of the transistors Q5 and Q6, and one of the transistors Q7 and Q8 are turned ON, while the other of the transistors Q1 and Q2, the other of the transistors Q3 and Q4, the other of the transistors Q5 and Q6, and the other of the transistors Q7 and Q8 are turned OFF, so that differential currents $I_{RF}^+$ and $I_{RF}^-$ generated from a linear differential circuit 101 by the RF signal $V_{RF}$ are switched. Thus, an intermediate signal $V_{IF}$ is obtained. Note that the doubly-polarity switching mixer of FIG. 10A also serves as an analog circuit and accordingly, serves as a three-input multiplier.

Figure 10B:
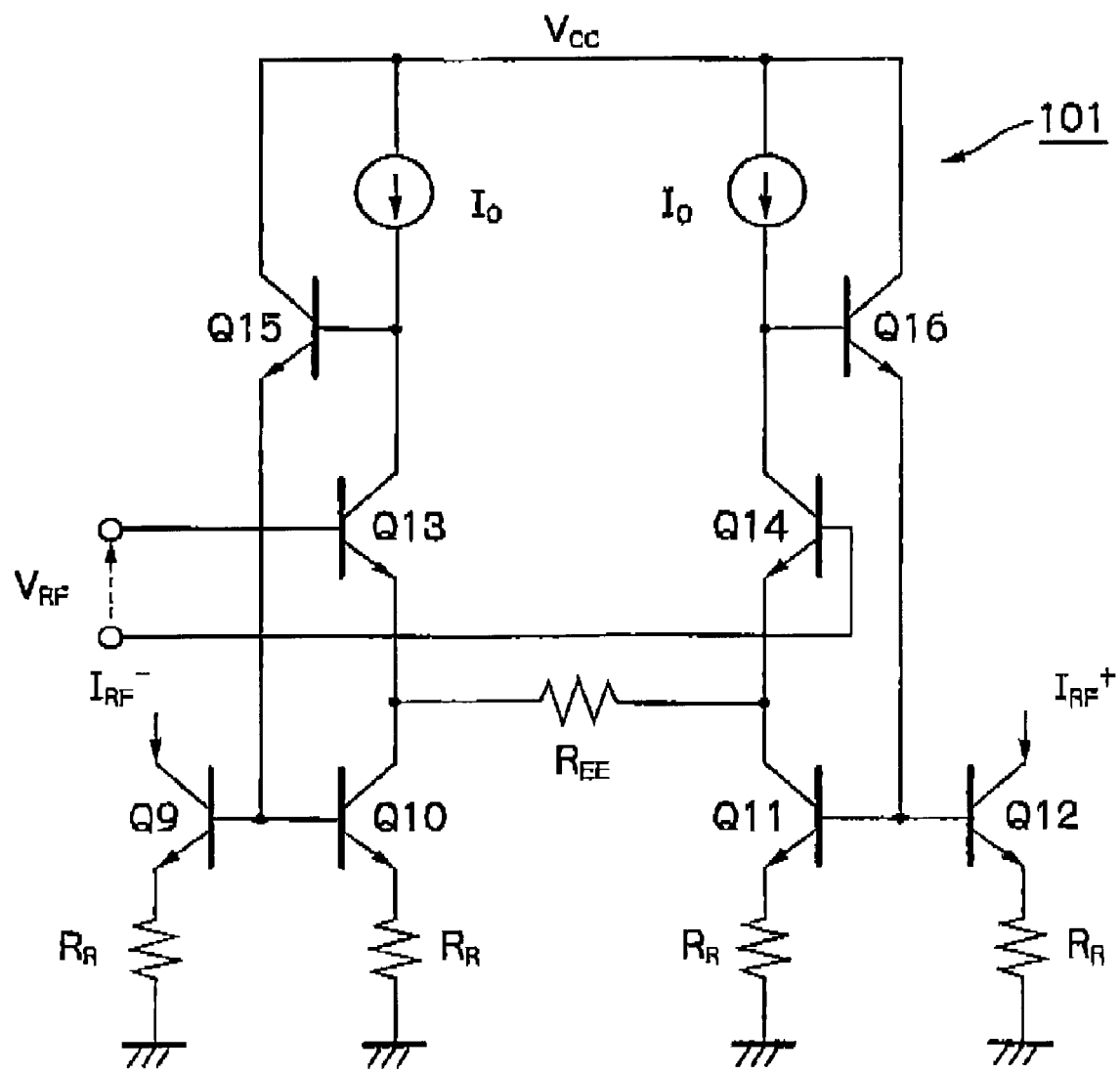
FIG. 10B is a detailed circuit diagram of the linear differential circuit of FIG. 10A.

In FIG. 10B, which is a detailed circuit diagram of the linear differential circuit 101 of FIG. 10A, a current mirror circuit is formed by bipolar transistors Q9 and Q10 and another current mirror circuit is formed by bipolar transistors Q11 and Q12. Collectors of the bipolar transistors Q10 and Q11 are connected to emitters of bipolar transistors Q13 and Q14, respectively, whose bases receive the RF signal $V_{RF}$. Also, an emitter degeneration resistor $R_{EE}$ is connected between the emitters of the bipolar transistors Q13 and Q14. Further, one current source $I_O$ is connected to each of the collectors of the bipolar transistors Q13 and Q14, and also, bases of bipolar transistors Q15 and Q16 serving as current sources to the current mirror circuits (Q9, Q10; Q11, Q12) are connected to the collectors of the bipolar transistors Q13 and Q14, respectively.

In FIG. 10B, the following differential currents $I_{RF}^+$ and $I_{RF}^-$ are generated from the collectors of the bipolar transistors Q9 and Q12.

$$I_{RF}^+ = I_O + V_{RF}/R_{EE} \tag{42}$$

$$I_{RF}^- = I_O - V_{RF}/R_{EE} \tag{43}$$

That is, the linear characteristics of the linear differential circuit 101 are determined by the emitter degeneration resistor $R_{EE}$. Note that a resistance manufactured by a semiconductor manufacturing process has excellent linear characteristics. Therefore, the linear differential circuit 101 has excellent linear characteristics.

Figure 11A:
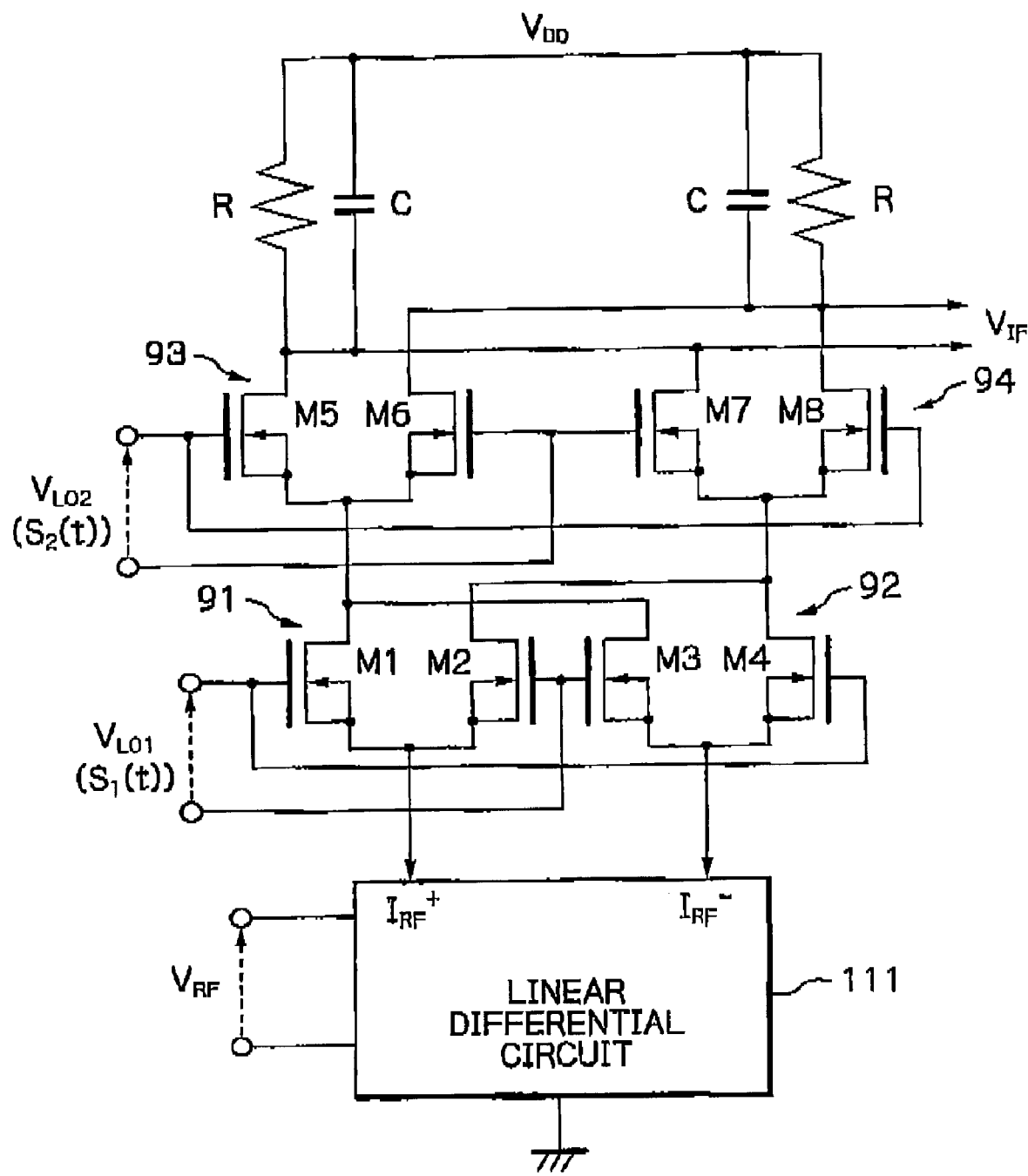
FIG. 11A is another detailed circuit diagram of the doubly-polarity switching mixer of FIG. 9.

In FIG. 11A, which illustrates another detailed circuit diagram of the doubly-polarity switching mixer of FIG. 9, each of the switches 91, 92, 93 and 94 are constructed by source-coupled pairs (current switches) of MOS transistors M1, M2; M3, M4; M5, M6; and M7, M8. In this case, one of the transistors M1 and M2, one of the transistors M3 and M4, one of the transistors M5 and M6, and one of the transistors M7 and M8 are turned ON, while the other of the transistors M1 and M2, the other of the transistors M3 and M4, the other of the transistors M5 and M6, and the other of the transistors M7 and M8 are turned OFF, so that differential currents $I_{RF}^+$ and $I_{RF}^-$ generated from a linear differential circuit 111 by the RF signal $V_{RF}$ are switched. Thus, an intermediate signal $V_{IF}$ is obtained. In the doubly-polarity switching mixer of FIG. 11A, the transconductance does not change monotonously for a small signal change. Therefore, the doubly-polarity switching mixer of FIG. 11A does not serve as an analog circuit and accordingly, does not serve as a three-input multiplier.

Figure 11B:
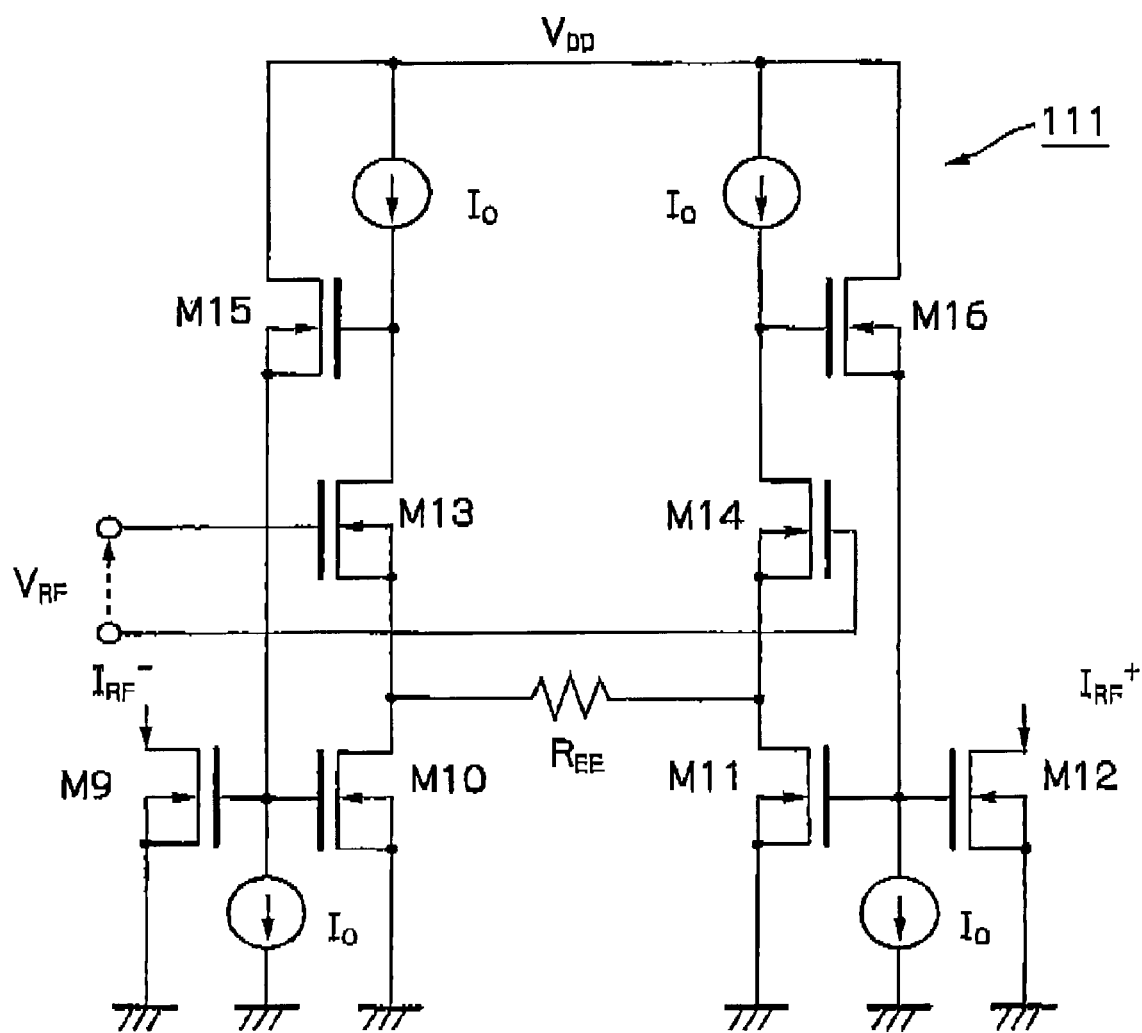
FIG. 11B is a detailed circuit diagram of the linear differential circuit of FIG. 11A.

In FIG. 11B, which is a detailed circuit diagram of the linear differential circuit 111 of FIG. 11A, a current mirror circuit is formed by MOS transistors M9 and M10 and another current mirror circuit is formed by MOS transistors M11 and M12. Drains of the MOS transistors M10 and M11 are connected to sources of MOS transistors M13 and M14, respectively, whose gates receives the RF signal $V_{RF}$. Also, a source degeneration resistor $R_{EE}$ is connected between the sources of the MOS transistors M13 and M14. Further, one current source $I_O$ is connected to each of the drains of the MOS transistors M13 and M14, and also, gates of MOS transistors M15 and M16 serving as current sources to the current mirror circuits (M9, M10; M11, M12) are connected to the drains of the MOS transistors M13 and M14, respectively.

Even in FIG. 11B, the differential currents $I_{RF}^+$ and $I_{RF}^-$ represented by the formulae (42) and (43) are generated from the drains of the MOS transistors M9 and M12.

That is, the linear characteristics of the linear differential circuit 111 are determined by the source degeneration resistor $R_{EE}$. Note that a resistance manufactured by a semiconductor manufacturing process has excellent linear characteristics. Therefore, the linear differential circuit III has excellent linear characteristics.

Generally, in frequency mixers, the suppression of high-order distortion characteristics such as second-order and third-order distortion characteristics, i.e., second-order and third-order intercept point characteristics are important. In the doubly-polarity switching mixers of FIGS. 10A and 11A, the high-order distortion characteristics can be sufficiently suppressed by the linear differential circuit of FIGS. 10B and 11B. However, in the doubly-polarity switching mixers of FIGS. 10A and 11A, the power supply voltage $V_{CC}$ or $V_{DD}$ needs to be higher than 2V.

Figure 12:
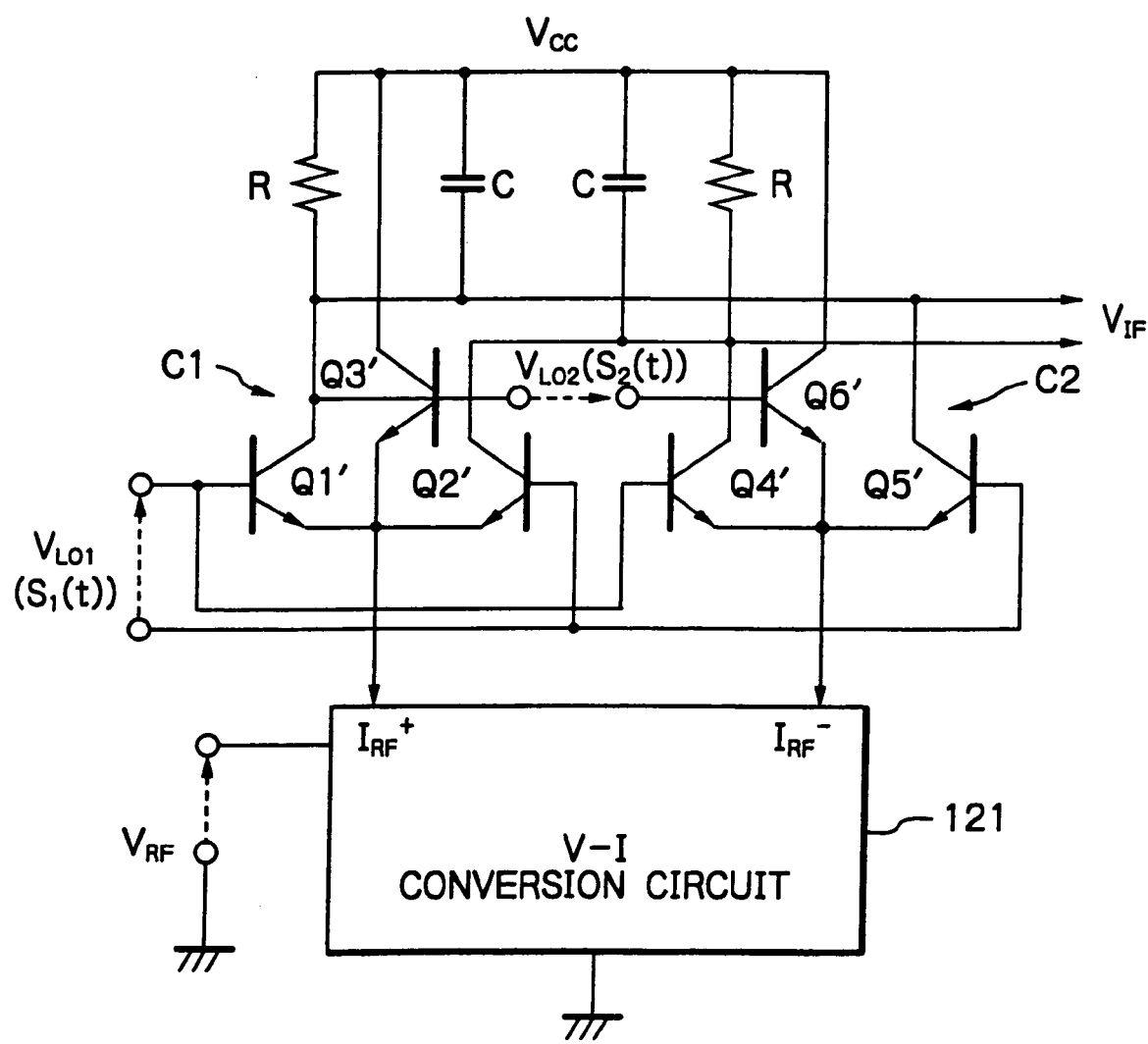
FIG. 12 is a circuit diagram illustrating a modification of the doubly-polarity switching mixer of FIG. 10A.

In FIG. 12, which illustrates a modification of the doubly-polarity switching mixer of FIG. 10A, two triple tail cells C1 and C2 are provided. In the triple tail cell C1, three emitter-coupled bipolar transistors Q1', Q2' and Q2' are driven by one tail current $I_{RF}^+$, while in the triple tail cell C2, three emitter-coupled bipolar transistors Q4', Q5' and Q6' are driven by one tail current $I_{RF}^-$. The tail currents $I_{RF}^+$ and $I_{RF}^-$ are generated by a V-I conversion circuit 121 which can be easily constructed by bipolar transistors whose emitters are grounded via emitter resistors, where use is made of base voltage-to-collector current characteristics as V-I characteristics. In FIG. 12, the power supply voltage $V_{CC}$ can be lower than 1V.

In more detail, the transistors Q1', Q2', Q4' and Q5' are switched by the local oscillator signal $V_{LO1}$ or $S_1(t)$, and the transistors Q3' and Q6' are switched by the local oscillator signal $V_{LO2}$ or $S_2(t)$. In this case, when the transistor Q3' is turned ON by the local oscillator signal $V_{LO2}$, the tail current $I_{RF}^+$ needs to be supplied from the power supply voltage $V_{CC}$ regardless of whether the transistors Q1' and Q2' are turned ON or OFF. On the other hand, when the transistor Q6' is turned ON by the local oscillator signal $V_{LO2}$, the tail current $I_{RF}^-$ needs to be supplied from the power supply voltage $V_{CC}$ regardless of whether the transistors Q4' and Q5' are turned ON or OFF. For this purpose, the transistors Q3' and Q6' are increased in size or the amplitude of the local oscillator signal $V_{LO2}$ is larger than that of the local oscillator signal $V_{LO1}$.

Thus, the doubly-polarity switching mixer of FIG. 12 is equivalent to the doubly-polarity switching mixer of FIGS. 10A and 10B and has an advantage in that the power supply voltage $V_{CC}$ is low.

Figure 13:
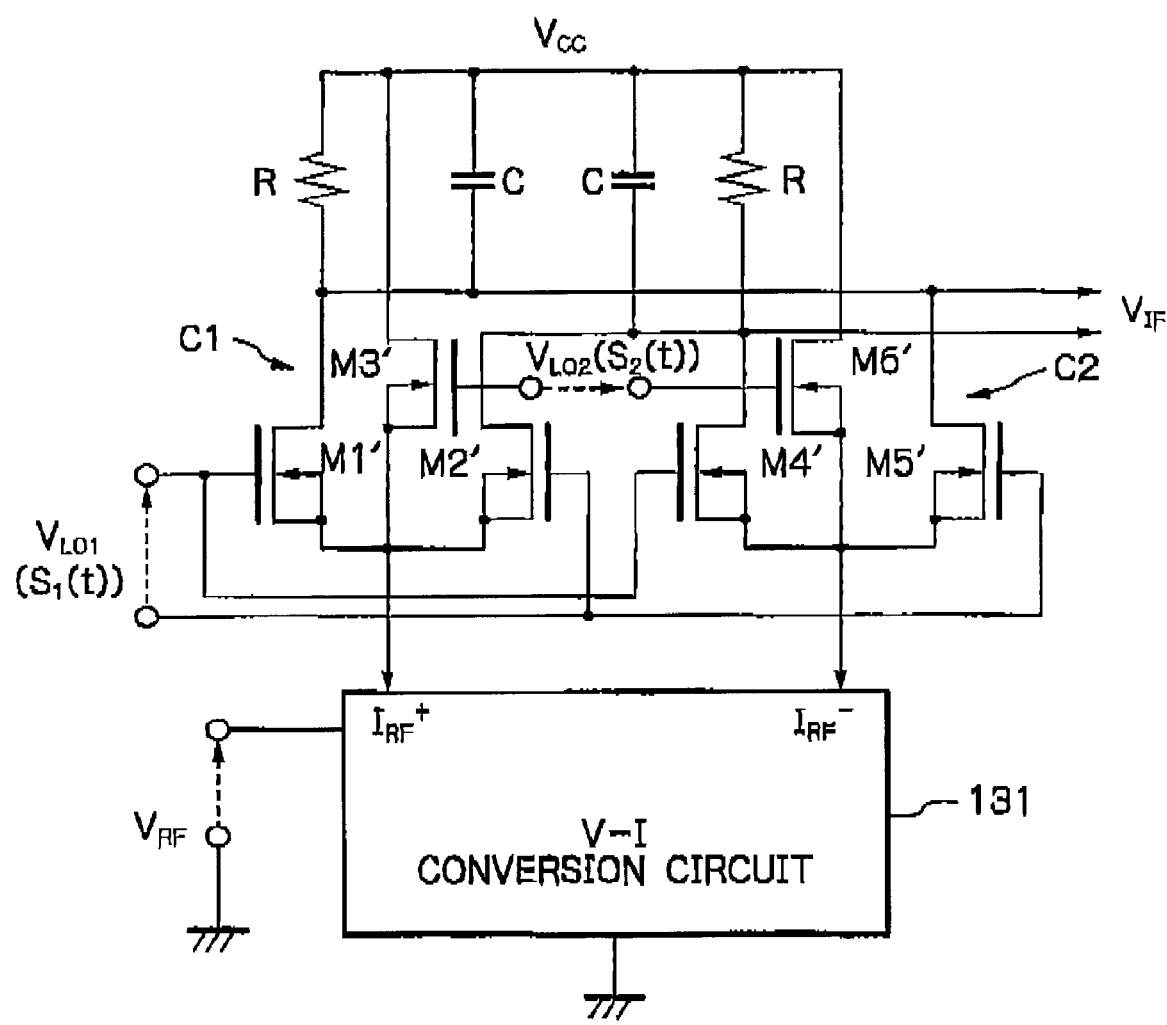
FIG. 13 is a circuit diagram illustrating a modification of the doubly-polarity switching mixer of FIG. 11A.

In FIG. 13, which illustrates a modification of the doubly-polarity switching mixer of FIG 11A, two triple tail cells C1 and C2 are provided. In the triple tail cell C1, three source-coupled MOS transistors M1', M2' and M2' are driven by one tail current $I_{RF}^+$, while, in the triple tail cell C2, three emitter-coupled MOS transistors M4', M5' and M6' are driven by one tail current $I_{RF}^-$. The tail currents $I_{RF}^+$ and $I_{RF}^-$ are generated by a V-I conversion circuit 131 which can be easily constructed by MOS transistors whose sources are grounded via source resistors, where use is made of gate voltage-to-drain current characteristics as V-I characteristics. In FIG. 13, the power supply voltage $V_{DD}$ can be lower than 1V.

In more detail, the transistors M1', M2', M4' and M5' are switched by the local oscillator signal $V_{LO1}$ or $S_1(t)$, and the transistors M3' and M6' are switched by the local oscillator signal $V_{LO2}$ or $S_2(t)$. In this case, when the transistor M3' is turned ON by the local oscillator signal $V_{LO2}$, the tail current $I_{RF}^+$ needs to be supplied from the power supply voltage $V_{DD}$ regardless of whether the transistors M1' and M2' are turned ON or OFF. On the other hand, when the transistor M6' is turned ON by the local oscillator signal $V_{LO2}$, the tail current $I_{RF}^-$ needs to be supplied from the power supply voltage $V_{DD}$ regardless of whether the transistors M4' and M5' are turned ON or OFF. For this purpose, the transistors M3' and M6' are increased in size or the amplitude of the local oscillator signal $V_{LO2}$ is larger than that of the local oscillator signal $V_{LO1}$.

Thus, the doubly-polarity switching mixer of FIG. 13 is equivalent to the doubly-polarity switching mixer of FIGS. 11A and 11B and has an advantage in that the power supply voltage $V_{DD}$ is low.

Figure 14A:
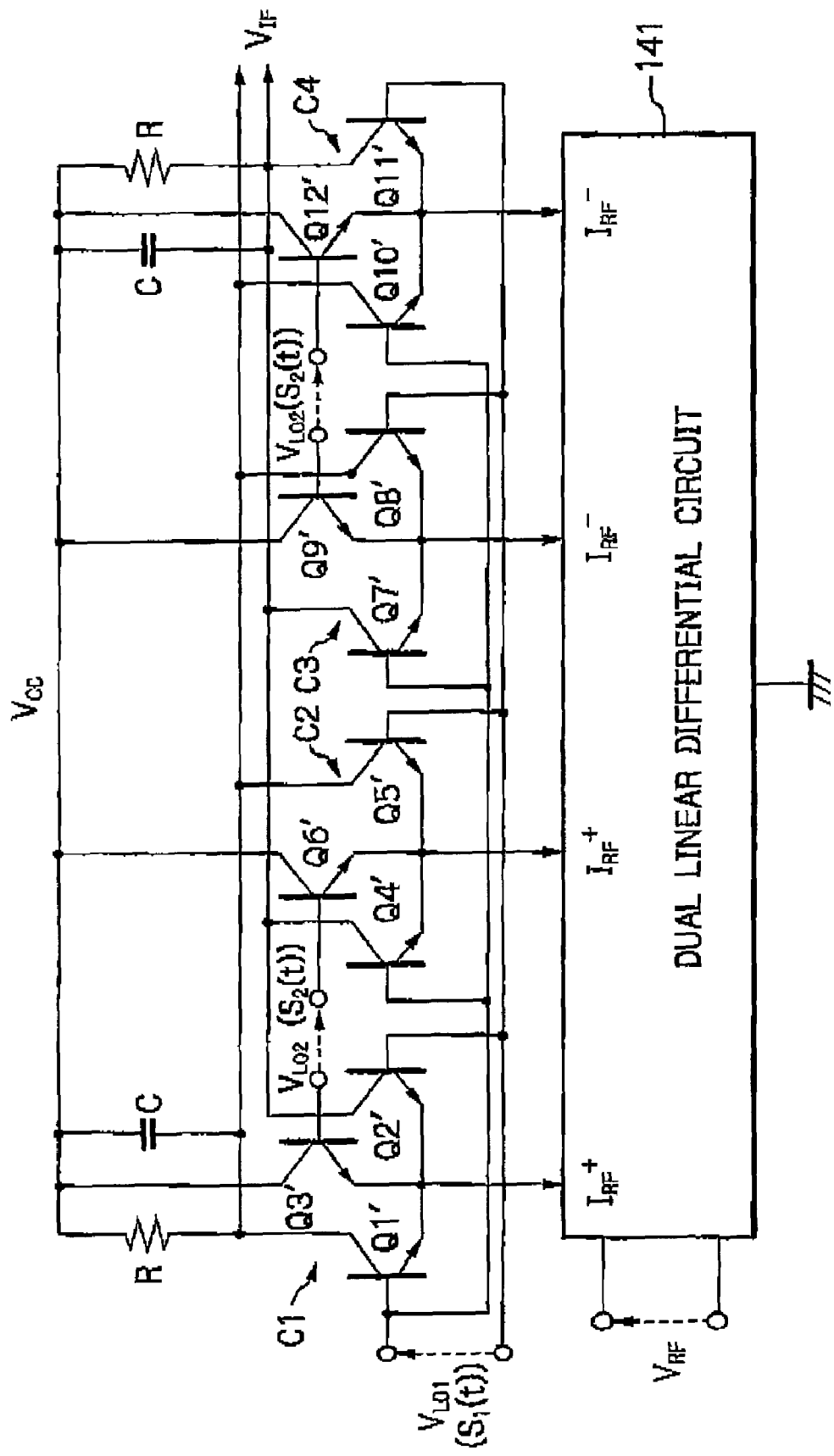
FIG. 14A is a circuit diagram illustrating a modification of the doubly-polarity switching mixer of FIG. 12.
Figure 14B:
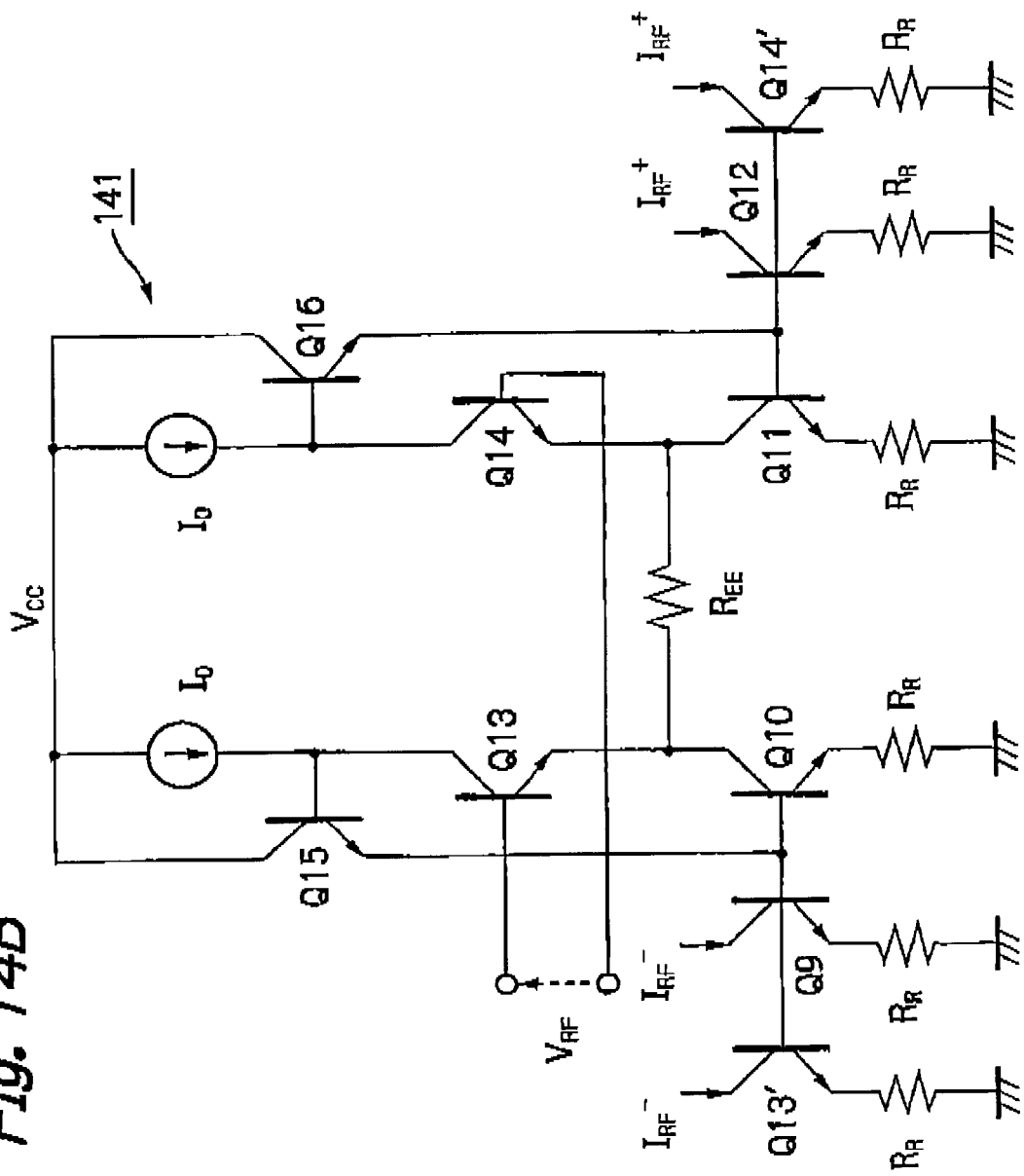
FIG. 14B is a detailed circuit diagram of the linear differential circuit of FIG. 14A.

In FIG. 14A, which illustrates a modification of the doubly-polarity switching mixer of FIG. 12, two triple tail cells C3 and C4 are added, and a dual linear differential circuit 141 is provided instead of the V-I conversion circuit 121 of FIG. 12. The dual linear differential circuit 141 which is similar to the linear differential circuit 101 of FIG. 10B is illustrated in detail in FIG. 14B. In the triple tail cell C3, three emitter-coupled bipolar transistors Q7', Q8' and Q9' are driven by one tail current $V_{RF}^+$, and in the triple tail cell C4, three emitter-coupled bipolar transistors Q10', Q11' and Q12' are driven by one tail current $I_{RF}^-$. In this case, the intermediate signal $V_{IF}$ is obtained by a difference between a sum current flowing through the transistors Q1', Q5', Q8' and Q10' and a sum current flowing through the transistors Q2', Q4', Q7' and Q11'.

Figure 15A:
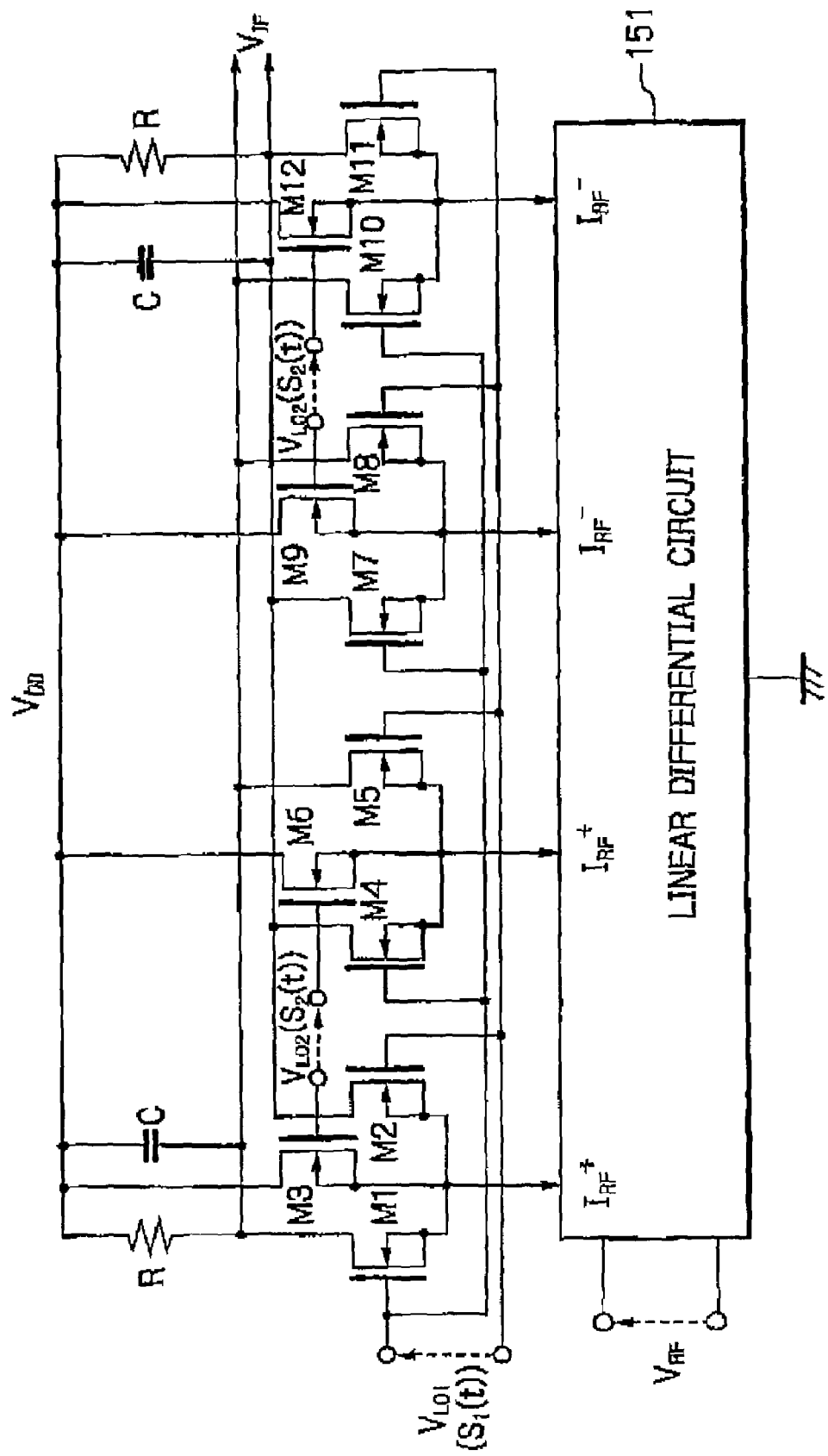
FIG. 15A is a circuit diagram illustrating a modification of the doubly-polarity switching mixer of FIG. 13.
Figure 15B:
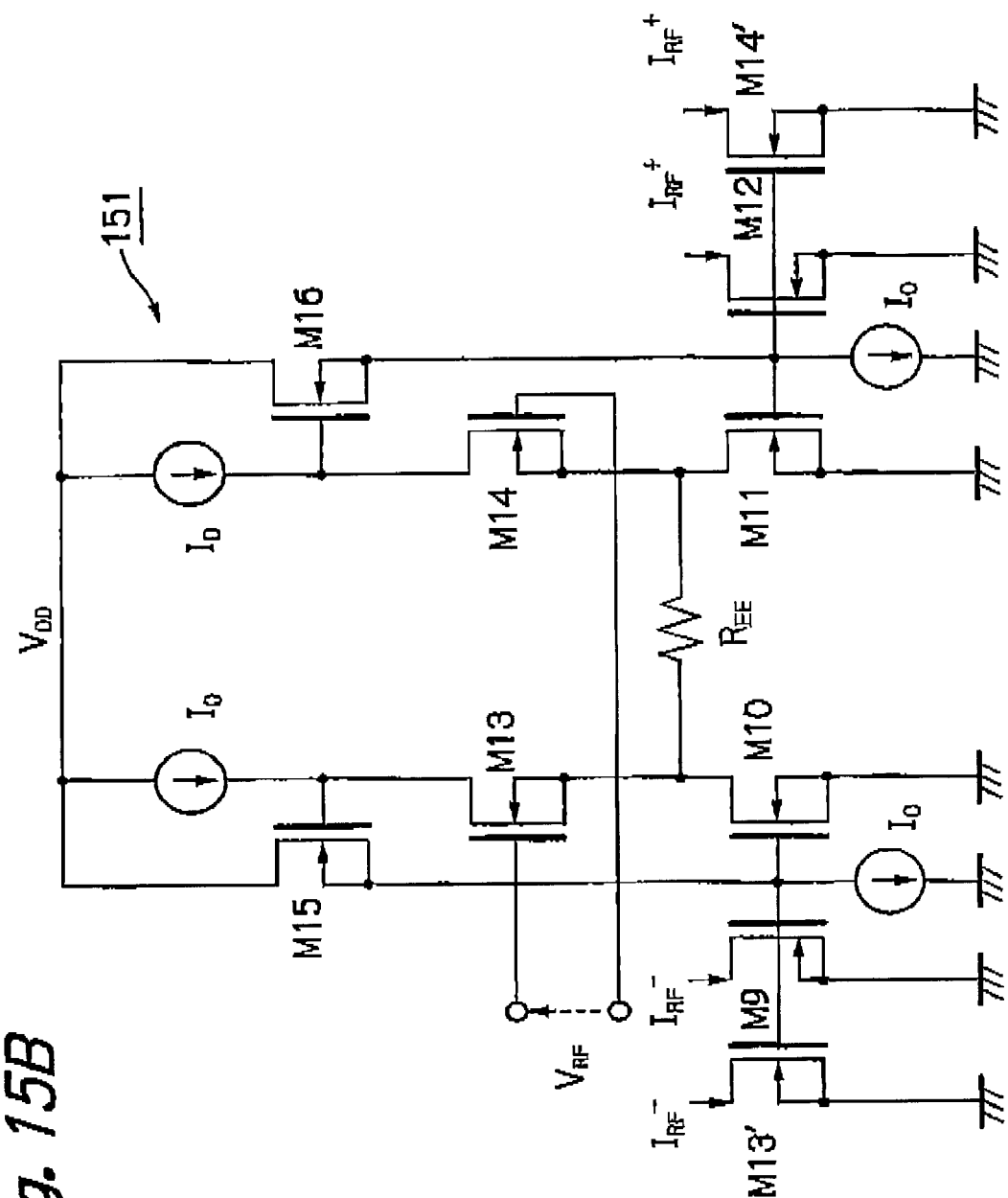
FIG. 15B is a detailed circuit diagram of the linear differential circuit of FIG. 15A.

In FIG. 15A, which illustrates a modification of the doubly-polarity switching mixer of FIG. 13, two triple tail cells C3 and C4 are added, and a dual linear differential circuit 151 is provided instead of the V-I conversion circuit 131 of FIG. 13. The dual linear differential circuit 151 which is similar to the linear differential circuit 101 of FIG. 11B is illustrated in detail in FIG. 15B. In the triple tail cell C3, three emitter-coupled bipolar transistors M7', M8' and M9' are driven by one tail current $V_{RF}^+$, and in the triple tail cell C4, three emitter-coupled bipolar transistors M10', M11' and M12' are driven by one tail current $I_{RF}^-$. In this case, the intermediate signal $V_{IF}$ is obtained by a difference between a sum current flowing through the transistors M1', M5', M8' and M10' and a sum current flowing through the transistors M2', M4', M7' and M11'.

In FIG. 16, which illustrates a third embodiment of the quadrature mixer circuit applied to a direct conversion type wireless receiver according to the present invention, a ½n(n=1, 2, . . . ) frequency divider 161 is provided instead of the ½-frequency divider 71 and 72 of FIG. 7. In the ¼-frequency divider 161 where n=1 is constructed by a Johnson counter, the quadrature mixer circuit of FIG. 16 is the same as that of FIG. 7.

In FIG. 16, $f_{RF}=(2n+1)f_{LO}/(2n)$

Also, since $f_{LO2}=f_{LO}/(2n)$ the frequency $f_{LO2}$ of the output signals of the ½n-frequency divider 161 is represented by $f_{RF}=(2n+1)f_{LO2}$ (44)

As apparent from the formulae (28) and (38), since the output signals of the ½n-frequency divider 161 are rectangular, odd-higher order harmonic frequencies (2j−1) $f_{LO2}$ (j=2, 3, . . . ) are included therein. From the formula (44), some of such harmonic frequencies always coincide with the frequency $f_{RF}$ of the RF signal $V_{RF}$, which would increase the DC offset and the reception trouble as in the prior art.

In FIG. 17, which illustrates a fourth embodiment of the quadrature mixer circuit applied to a direct conversion type wireless receiver according to the present invention, a 1/m-frequency divider 171 is connected to the voltage controlled oscillator 33" to generate a first local oscillator signal $u_{LO1}$, and a 1/m'-frequency divider 172 is connected to the voltage controlled oscillator 33" to generate a second local oscillator signal $u_{LO2}$. In this case, $f_{LO1}=f_{LO}/m$ $f_{LO2}=f_{LO}/m'$ then, $f_{RF}=f_{LO1}+f_{LO2}=f_{LO}/m+f_{LO}/m'=(m+m')/(m\ m')\cdot f_{LO}$ (45)

The frequency component of the first local oscillator signal $u_{LO1}$ includes (2i−1) $f_{LO}$/m (i=1, 2, . . . ) and the frequency component of the second local oscillator signal $u_{LO2}$ includes (2j−1) $f_{LO}$/m'(j=1, 2, . . . ). These frequencies should not coincide with the frequency $f_{RF}$ of the RF signal. That is, $(m+m')/(m\ m')\neq 1$ $(2i-1)/m \neq (m+m')/(m\ m')$ $(2j-1)/m' \neq (m+m')/(m\ m')$ In other words, $$\frac{1}{i}m + \frac{1}{j}m' \neq 1 \quad (46)$$

$$i \neq m/(2m') + 1 \quad (47)$$

$$j \neq m'/(2m) + 1 \quad (48)$$

From the formulae (47) and (48), i. j=2, 3, . . . .

The values of m and m' satisfying the formulae (46), (47) and (48) are shown in FIG. 18. In this case, any even-ordered high order waves of the local oscillator signals do not coincide with the frequency $f_{RF}$ of the RF signal. Also, in any cases, $f_{LO} > f_{RF}$. For example, the values m and m' satisfying that $f_{RF} < f_{LO} < 2f_{RF}$ are as follows:

$f_{LO} = 6f_{RF}/5$ at $(m, m') = (3, 2)$ $f_{LO} = 10f_{RF}/7$ at $(m, m') = (5, 2)$ $f_{LO} = 14f_{RF}/9$ at $(m, m') = (7, 2)$ $f_{LO} = 18f_{RF}/11$ at $(m, m') = (9, 2)$ $f_{LO} = 5f_{RF}/3$ at $(m, m') = (10, 2)$ $f_{LO} = 22f_{RF}/13$ at $(m, m') = (11, 2)$ $f_{LO} = 26f_{RF}/15$ at $(m, m') = (13, 2)$ $f_{LO} = 7f_{RF}/4$ at $(m, m') = (14, 2)$ $f_{LO} = 52f_{RF}/17$ at $(m, m') = (15, 2)$ $f_{LO} = 12f_{RF}/7$ at $(m, m') = (3, 4)$ $f_{LO} = 3f_{RF}/2$ at $(m, m') = (2, 6)$

Also, the values of m and m' satisfying that $f_{RF} < f_{LO} < 1.5f_{RF}$ are as follows:

$f_{LO} = 6f_{RF}/5$ at $(m, m') = (3, 2)$ $f_{LO} = 10f_{RF}/7$ at $(m, m') = (5, 2)$

In FIG. 17, if the $1/m'$-frequency divider 172 includes a Johnson counter ($\frac{1}{2}$-frequency divider), $$m' = 2n (n=1, 2, \ldots)$$

Then, $$f_{RF} = (m + 2n)(2mn) \cdot f_{LO} \quad (50)$$

Even in this case, the frequency component of the first local oscillator signal $u_{LO1}$ includes $(2i-1) f_{LO}/m$ (i=1, 2, . . . ) and the frequency component of the second local oscillator signal $u_{LO2}$ includes $(2j-1) f_{LO}/(2n)(j=1, 2, \ldots)$. These frequencies should not coincide with the frequency $f_{RF}$ of the RF signal. That is, $$(m+2n)/(2m\ n) \neq 1$$

$$(2i-1)/m \neq (m+2n)/(2m\ n)$$

$$(2j-1)/2n \neq (m+2n)/(2m\ n)$$

In other words, $$1/m + \frac{1}{2}n \neq 1 \quad (51)$$

$$i \neq m/(4n) + 1 \quad (52)$$

$$j \neq n/m + 1 \quad (53)$$

From the formulae (52) and (53), i. j=2, 3, . . . .

The values of m and 2n satisfying the formulae (51), (52) and (53) are shown in FIG. 19. In this case, any even-ordered high order waves of the local oscillator signals do not coincide with the frequency $f_{RF}$ of the RF signal. Also, in any cases, $f_{LO} > f_{RF}$. For example, the values m and n satisfying that $f_{RF} < f_{LO} < 2f_{RF}$ are as follows:

$f_{LO} = 6f_{RF}/5$ at $(m, n) = (3, 1)$ $f_{LO} = 10f_{RF}/7$ at $(m, n) = (5, 1)$ $f_{LO} = 14f_{RF}/9$ at $(m, n) = (7, 1)$ $f_{LO} = 18f_{RF}/11$ at $(m, n) = (9, 1)$ $f_{LO} = 5f_{RF}/3$ at $(m, n) = (10, 1)$ $f_{LO} = 22f_{RF}/13$ at $(m, n) = (11, 1)$ $f_{LO} = 26f_{RF}/15$ at $(m, n) = (13, 1)$ $f_{LO} = 7f_{RF}/4$ at $(m, n) = (14, 1)$ $f_{LO} = 52f_{RF}/17$ at $(m, n) = (15, 1)$ $f_{LO} = 12f_{RF}/7$ at $(m, n) = (3, 2)$ $f_{LO} = 3f_{RF}/2$ at $(m, n) = (2, 3)$

Also, the values of m and m' satisfying that $f_{RF} < f_{LO} < 1.5f_{RF}$ are as follows:

$f_{LO} = 6f_{RF}/5$ at $(m, n) = (3, 1)$ $f_{LO} = 10f_{RF}/7$ at $(m, n) = (5, 1)$

According to the inventor's calculation the noise factor (NF) of the quadrature mixer circuit according to the present invention was about 7 dB while the NF of the first prior art quadrature mixer circuit as illustrated in FIG. 1 was 3.01 dB. Such deterioration of the NF can be compensated for by increasing the power gain of the AGC amplifiers 6 and 7 in a direct conversion type wireless receiver, and accordingly, there is no actual problem.

Also, the present invention can be applied to a low IF type wireless receiver.

As explained hereinabove, according to the present invention, the DC offset can be decreased, the reception trouble can be suppressed, and the number of components can be decreased.

The invention claimed is:

1. A quadrature mixer circuit for receiving a radio frequency signal to generate first and second quadrature output signals, comprising:

a first three-input mixer for receiving said radio frequency signal, a first local signal having a first frequency and a second local signal having a second frequency to generate said first quadrature output signal; and a second three-input mixer for receiving said radio frequency signal, said first local signal and said second local signal to generate said second quadrature output signal, wherein said second local signal received by said first three-input mixer and said second local signal received by said second three-input mixer are out of phase by $\pi/2$ from each other;

wherein each of said three-input mixers comprises a doubly-polarity switching mixer; and wherein said first and second local signals are rectangular.

2. The quadrature mixer circuit as set forth in claim 1, further comprising:
an oscillator for generating said first local signal; and
a frequency divider, connected to said oscillator, for generating said second local signal.

3. The quadrature mixer circuit as set forth in claim 2, wherein said frequency divider comprises a ½-frequency divider for generating said second local signal and a phase-shifted signal of said second local signal by a phase of $\pi/2$.

4. The quadrature mixer circuit as set forth in claim 1, further comprising:
an oscillator;
a $1/m'$-frequency divider, connected to said oscillator, for generating said first local signal;
a $1/m'$-frequency divider, connected to said oscillator, for generating said second local signal.

5. The quadrature mixer circuit as set forth in claim 4, wherein the values of m and m' satisfy:

$1/m + 1/m' \neq 1$, $i \neq m(2m') + 1$, and $j \neq m'/(2m) + 1$ where i,j=2,3 . . . .

6. The quadrature mixer circuit as set forth in claim 1, further comprising:
an oscillator;
a $1/m$-frequency divider, connected to said oscillator, for generating said first local signal;
a $1/(2n)$-frequency divider, connected to said oscillator, for generating said second local signal.

7. The quadrature mixer circuit as set forth in claim 6, wherein the values of m and n satisfy:

$1/m + 1/(2n) \neq 1$, $i \neq m/(4n) + 1$, and $j \neq n/m + 1$ where i,j=2,3 . . . .

8. The quadrature mixer circuit as set forth in claim 1, wherein said doubly-polarity switching mixer comprises non-linear elements showing three-order transfer characteristics for said radio frequency signal, said first local signal and said second local signal.

9. The quadrature mixer circuit as set forth in claim 8, wherein said non-linear elements comprise bipolar transistors.

10. The quadrature mixer circuit as set forth in claim 8, wherein said non-linear elements comprise MOS transistors.

11. The quadrature mixer circuit as set forth in claim 1, wherein said doubly-polarity switching mixer comprises:
a linear differential circuit for generating first and second differential currents in response to said radio frequency signal;
first and second bipolar transistors having a common emitter for receiving said first differential current, said first local signal being supplied between bases of said first and second bipolar transistors;
third and fourth bipolar transistors having a common emitter for receiving said second differential current, said first local signal being supplied between bases of said third and fourth bipolar transistors;
fifth and sixth bipolar transistors having a common emitter connected to a common collector of said first and third bipolar transistors, said second local signal being supplied between bases of said fifth and sixth bipolar transistors;
seventh and eighth bipolar transistors having a common emitter connected to a common collector of said second and fourth bipolar transistors, said second local signal being supplied between bases of said seventh and eighth bipolar transistors;
a respective one of said first and second quadrature output signals being a difference between a sum current flowing through said sixth and eighth bipolar transistors and a sum current flowing through said fifth and seventh bipolar transistors.

12. The quadrature mixer circuit as set forth in claim 1, wherein said doubly-polarity switching mixer comprises:
a linear differential circuit for generating first and second differential currents in response to said radio frequency signal;
first and second MOS transistors having a common source for receiving said first differential current, said first local signal being supplied between gates of said first and second MOS transistors;
third and fourth MOS transistors having a common source for receiving said second differential current, said first local signal being supplied between gates of said third and fourth MOS transistors;
fifth and sixth MOS transistors having a common source connected to a common drain of said first and third MOS transistors, said second local signal being supplied between gates of said fifth and sixth MOS transistors;
seventh and eighth MOS transistors having a common source connected to a common drain of said second and fourth MOS transistors, said second local signal being supplied between gates of said seventh and eighth MOS transistors;
a respective one of said first and second quadrature output signals being a difference between a sum current flowing through said sixth and eighth MOS transistors and a sum current flowing through said fifth and seventh MOS transistors.

13. The quadrature mixer circuit as set forth in claim 1, wherein said doubly-polarity switching mixer comprises:
a voltage-to-current conversion circuit for converting said radio frequency signal into first and second differential currents;
first, second and third bipolar transistors having a common emitter for receiving said first differential current, said first local signal being supplied between bases of said first and second bipolar transistors, a collector of said third bipolar transistor being connected to a power supply terminal; and
fourth, fifth and sixth bipolar transistors having a common emitter for receiving said second differential current, said first local signal being supplied between bases of said fourth and fifth bipolar transistors, a collector of said sixth bipolar transistor being connected to said power supply terminal,
said second local signal being supplied between bases of said third and sixth bipolar transistors,
a respective one of said first quadrature output signals being a difference between a sum current flowing through said first and fifth bipolar transistors and a sum current flowing through said second and fourth bipolar transistors.

14. The quadrature mixer circuit as set forth in claim 1, wherein said doubly-polarity switching mixer comprises:

a voltage-to-current conversion circuit for converting said radio frequency signal into first and second differential currents;

first, second and third MOS transistors having a common source for receiving said first differential current, said first local signal being supplied between gates of said first and second MOS transistors, a drain of said third MOS transistor being connected to a power supply terminal; and fourth, fifth and sixth MOS transistors having a common source for receiving said second differential current, said first local signal being supplied between gates of said fourth and fifth MOS transistors, a drain of said sixth MOS transistor being connected to said power supply terminal, said second local signal being supplied between gates of said third and sixth MOS transistors, a respective one of said first quadrature output signals being a difference between a sum current flowing through said first and fifth MOS transistors and a sum current flowing through said second and fourth MOS transistors.

15. The quadrature mixer circuit as set forth in claim 1, wherein said doubly-polarity switching mixer comprises:

a dual linear differential circuit for generating first, second, third and fourth differential currents, said first and second differential currents being similar to each other, said third and fourth differential currents being similar to each other;

first, second and third bipolar transistors having a common emitter for receiving said first differential current, said first local signal being supplied between bases of said first and second bipolar transistors, a collector of said third bipolar transistor being connected to a power supply terminal;

fourth, fifth and sixth bipolar transistors having a common emitter for receiving said second differential current, said first local signal being supplied between bases of said fourth and fifth bipolar transistors, a collector of said sixth bipolar transistor being connected to said power supply terminal;

seventh, eighth and ninth bipolar transistors having a common emitter for receiving said third differential current, said first local signal being supplied between bases of said seventh and eighth bipolar transistors, a collector of said ninth bipolar transistor being connected to said power supply terminal; and tenth, eleventh and twelfth bipolar transistors having a common emitter for receiving said fourth differential current, said first local signal being supplied between bases of said tenth and eleventh bipolar transistors, a collector of said twelfth bipolar transistor being connected to said power supply terminal;

said second local signal being supplied between bases of said third and sixth bipolar transistors, said second local signal being supplied between bases of said ninth and twelfth bipolar transistors, a respective one of said first quadrature output signals being a difference between a sum current flowing through said first, fifth, eighth and tenth bipolar transistors and a sum current flowing through said second, fourth, seventh and eleventh bipolar transistors.

16. The quadrature mixer circuit as set forth in claim 1, wherein said doubly-polarity switching mixer comprises:

a dual linear differential circuit for generating first, second, third and fourth differential currents, said first and second differential currents being similar to each other, said third and fourth differential currents being similar to each other;

first, second and third MOS transistors having a common source for receiving said first differential current, said first local signal being supplied between gates of said first and second MOS transistors, a drain of said third MOS transistor being connected to a power supply terminal;

fourth, fifth and sixth MOS transistors having a common source for receiving said second differential current, said first local signal being supplied between gates of said fourth and fifth MOS transistors, a drain of said sixth MOS transistor being connected to said power supply terminal;

seventh, eighth and ninth MOS transistors having a common source for receiving said third differential current, said first local signal being supplied between gates of said seventh and eighth MOS transistors, a drain of said ninth MOS transistor being connected to said power supply terminal; and tenth, eleventh and twelfth MOS transistors having a common source for receiving said fourth differential current, said first local signal being supplied between gates of said tenth and eleventh MOS transistors, a drain of said twelfth MOS transistor being connected to said power supply terminal;

said second local signal being supplied between gates of said third and sixth MOS transistors, said second local signal being supplied between gates of said ninth and twelfth MOS transistors, a respective one of said first quadrature output signals being a difference between a sum current flowing through said first, fifth, eighth and tenth MOS transistors and a sum current flowing through said second, fourth, seventh and eleventh MOS transistors.

17. The quadrature mixer circuit as set forth in claim 1, applied to a direct conversion type wireless receiver.

18. The quadrature mixer circuit as set forth in claim 1, applied to a low intermediate frequency type wireless receiver.

* * * * *